(12) United States Patent
Hong et al.

(10) Patent No.: US 11,201,195 B2
(45) Date of Patent: Dec. 14, 2021

(54) ELECTRONIC DEVICE INCLUDING FLEXIBLE DISPLAY PANEL

(71) Applicant: Samsung Electronics Co., Ltd., Gyeonggi-do (KR)

(72) Inventors: Sung Won Hong, Gyeonggi-do (KR); Yong Hwan Kim, Seoul (KR); Eui Jin Kim, Gyeonggi-do (KR); Hak Yeol Kim, Gyeonggi-do (KR); Jong Dae Park, Gyeonggi-do (KR); Woo Young Oh, Gyeonggi-do (KR); Su Jin Yun, Gyeonggi-do (KR); Kwang Tai Kim, Gyeonggi-do (KR); Hyung Sup Byeon, Gyeonggi-do (KR); Su Cheol Cheong, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 281 days.

(21) Appl. No.: 16/052,734

(22) Filed: Aug. 2, 2018

(65) Prior Publication Data

US 2019/0043928 A1    Feb. 7, 2019

(30) Foreign Application Priority Data

Aug. 2, 2017    (KR) .................. 10-2017-0098289

(51) Int. Cl.
*H01L 27/32* (2006.01)
*G06F 3/041* (2006.01)
(Continued)

(52) U.S. Cl.
CPC .......... *H01L 27/323* (2013.01); *G06F 3/0412* (2013.01); *G06F 3/04164* (2019.05);
(Continued)

(58) Field of Classification Search
CPC .............. H01L 27/323; H01L 27/3276; H01L 51/5253; H01L 51/0097
(Continued)

(56) References Cited

U.S. PATENT DOCUMENTS 9,195,108 B2    11/2015    Park et al.
9,318,427 B2    4/2016    Youn et al.
(Continued)

FOREIGN PATENT DOCUMENTS

CN    106816458 A    6/2017
CN    106876431 A    6/2017

OTHER PUBLICATIONS

European Search Report dated May 26, 2020.

*Primary Examiner* — Fred Tzeng
(74) *Attorney, Agent, or Firm* — Cha & Reiter, LLC

(57) ABSTRACT

An electronic device includes a first lead, a second lead, a touch sensitive display panel including a screen area and an extended area that extends from the screen area, and a control circuit. The touch sensitive display panel includes a flexible substrate, a thin film transistor (TFT) layer including a plurality of light-emitting elements, an insulation layer in which a via-hole is formed, and a touch sensor. The first lead is formed on the TFT layer in the screen area and the extended area and connects the control circuit and the plurality of light-emitting elements. The second lead is formed on the insulation layer in the screen area and on the TFT layer in the extended area, and extends from the screen area to the extended area through the via-hole formed in the insulation layer and connects the control circuit and the touch sensor.

19 Claims, 11 Drawing Sheets

(51) Int. Cl.
*H01L 51/52* (2006.01)
*H01L 51/00* (2006.01)
*G06F 3/044* (2006.01)

(52) U.S. Cl.
CPC ...... *H01L 27/3276* (2013.01); *H01L 51/0097* (2013.01); *H01L 51/5253* (2013.01); *G06F 3/044* (2013.01); *G06F 2203/04102* (2013.01); *H01L 2251/5338* (2013.01)

(58) Field of Classification Search
USPC ........................................................ 345/173
See application file for complete search history.

(56) References Cited

U.S. PATENT DOCUMENTS

| | | | |
|---|---|---|---|
| 9,419,065 B2 | 8/2016 | Degner et al. | |
| 9,647,052 B2 | 5/2017 | Youn et al. | |
| 9,939,699 B2 | 4/2018 | Park et al. | |
| 2010/0072470 A1* | 3/2010 | Yamazaki | H01L 27/124 257/43 |
| 2010/0084653 A1* | 4/2010 | Yamazaki | H01L 27/1225 257/43 |
| 2011/0084268 A1* | 4/2011 | Yamazaki | H01L 29/4908 257/43 |
| 2014/0042406 A1 | 2/2014 | Degner et al. | |
| 2014/0055702 A1 | 2/2014 | Park et al. | |
| 2014/0217373 A1 | 8/2014 | Youn et al. | |
| 2015/0060817 A1 | 3/2015 | Sato et al. | |
| 2016/0079336 A1 | 3/2016 | Youn et al. | |
| 2016/0085125 A1 | 3/2016 | Park et al. | |
| 2016/0093685 A1 | 3/2016 | Kwon et al. | |
| 2016/0336523 A1 | 11/2016 | Kwon et al. | |
| 2017/0090661 A1 | 3/2017 | Kim et al. | |
| 2017/0207276 A1 | 7/2017 | Miyamoto et al. | |
| 2017/0222180 A1 | 8/2017 | Sato et al. | |
| 2017/0236877 A1* | 8/2017 | Jeong | H01L 27/124 257/40 |
| 2018/0062094 A1 | 3/2018 | Kwon et al. | |
| 2018/0097042 A1 | 4/2018 | Miyamoto et al. | |
| 2018/0114950 A1* | 4/2018 | Lee | H01L 51/5281 |
| 2018/0219165 A1 | 8/2018 | Kwon et al. | |
| 2018/0267649 A1 | 9/2018 | Ye | |
| 2018/0356921 A1 | 12/2018 | Ye | |
| 2019/0027540 A1 | 1/2019 | Miyamoto et al. | |
| 2019/0109296 A1 | 4/2019 | Sato et al. | |
| 2019/0319077 A1 | 10/2019 | Miyamoto et al. | |
| 2020/0020747 A1* | 1/2020 | Bok | H01L 27/3276 |

* cited by examiner

ELECTRONIC DEVICE INCLUDING FLEXIBLE DISPLAY PANEL

CROSS-REFERENCE TO RELATED APPLICATION(S)

This application is based on and claims priority under 35 U.S.C. § 119 to Korean Patent Application No. 10-2017-0098289, filed on Aug. 2, 2017, in the Korean Intellectual Property Office, the disclosure of which is incorporated by reference herein its entirety.

BACKGROUND

1. Field

Embodiments of the present disclosure described herein relate to an electronic device including a display panel.

2. Description of Related Art

Various types of electronic devices, such as a smartphone, a tablet personal computer (PC), and the like, which include a display. The displays of the electronic devices may be implemented with what is called a touch screen display that includes a touch panel. The electronic devices may execute various functions, such as taking a photo or video, reproducing a music or video file, playing a game, doing a search on the Internet, and the like, through the touch screen display.

In recent years, many attempts have been made to minimize a bezel area of an electronic device at the same time as making a touch screen display larger in size.

The above information is presented as background information only to assist with an understanding of the present disclosure. No determination has been made, and no assertion is made, as to whether any of the above might be applicable as prior art with regard to the present disclosure.

SUMMARY

A flexible display panel may be used to make a display of an electronic device larger in size and to minimize a bezel area. In this case, a lower substrate of the display may be bent, and various types of hardware modules may be arranged below a front surface of the electronic device. As a result, a display area may maximized on the front surface of the electronic device, while the bezel area may be minimized.

The hardware modules below the front surface of the electronic device may be connected to electrical elements in a screen area of the display through leads arranged in a bent area of the display panel. For example, a display driver IC may be connected to light-emitting elements through the leads arranged in the bent area of the display panel. In another example, a touch sensor IC may be connected to a touch sensor through the leads arranged in the bent area of the display panel.

In the case where various types of leads are arranged in the bent area, tension exerted on the leads may increase with an increase in curvature of the bent area. When the lower substrate of the display is bent, the path across the display between two points elongates causing tension to be exerted on the leads. Especially, in the case where the leads vertically overlap one another, stronger tension may be exerted on leads disposed on the outside of the bent area under the influence of leads disposed on the inside of the bent area.

The increased tension exerted on the leads may increase the possibility of cracks in the leads, or reduce the time period before wear and tear result in cracks, causing a malfunction in the display of the electronic device.

Aspects of the present disclosure may address at least the above-mentioned problems and/or disadvantages and may provide at least some of the advantages described below. Accordingly, an aspect of the present disclosure is to provide a method that may lower the possibility of cracks in leads arranged in a display panel and an electronic device for performing the same.

In accordance with an aspect of the present disclosure, an electronic device includes a first lead, a second lead, a touch sensitive display panel divided into a screen area and an extended area that extends from the screen area, and a control circuit electrically connected to the touch sensitive display panel through the first lead and the second lead. The touch sensitive display panel includes a flexible substrate, a thin film transistor (TFT) layer formed on the flexible substrate and including a plurality of light-emitting elements, an insulation layer that is disposed on the TFT layer and in which a via-hole is formed, and a touch sensor disposed on the insulation layer. The first lead is formed on the TFT layer in the screen area and the extended area and connects the control circuit and the plurality of light-emitting elements. The second lead is formed on the insulation layer in the screen area and on the TFT layer in the extended area, and extends from the screen area to the extended area through the via-hole formed in the insulation layer and connects the control circuit and the touch sensor.

In accordance with an aspect of the present disclosure, a touch sensitive display panel includes a flexible substrate, a thin film transistor (TFT) layer formed on the flexible substrate and including a plurality of light-emitting elements, an insulation layer that is disposed on the TFT layer, and a touch sensor disposed on the insulation layer, wherein the touch sensitive display panel includes a screen area and an extended area that extends from the screen area, wherein the plurality of light-emitting elements are connected to at least one control circuit through a first lead formed on the TFT layer in the screen area and the extended area, wherein the touch sensor is connected to the at least one control circuit through a second lead formed on the insulation layer in the screen area and the extended area, and wherein the first lead and the second lead do not overlap each other in the extended area when viewed in a direction perpendicular to the extended area.

According to embodiments of the present disclosure, it is possible to lower the possibility of cracks in leads arranged in a bent area of a display panel in an electronic device. Accordingly, it is possible to set the curvature of the bent area to a larger value and to minimize a bezel area with an increase in size of a screen area where the display panel is exposed. In addition, the present disclosure may provide various effects that are directly or indirectly recognized.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numerals are used to depict the same or similar components, features, and structures.

DETAILED DESCRIPTION

Figure 1:
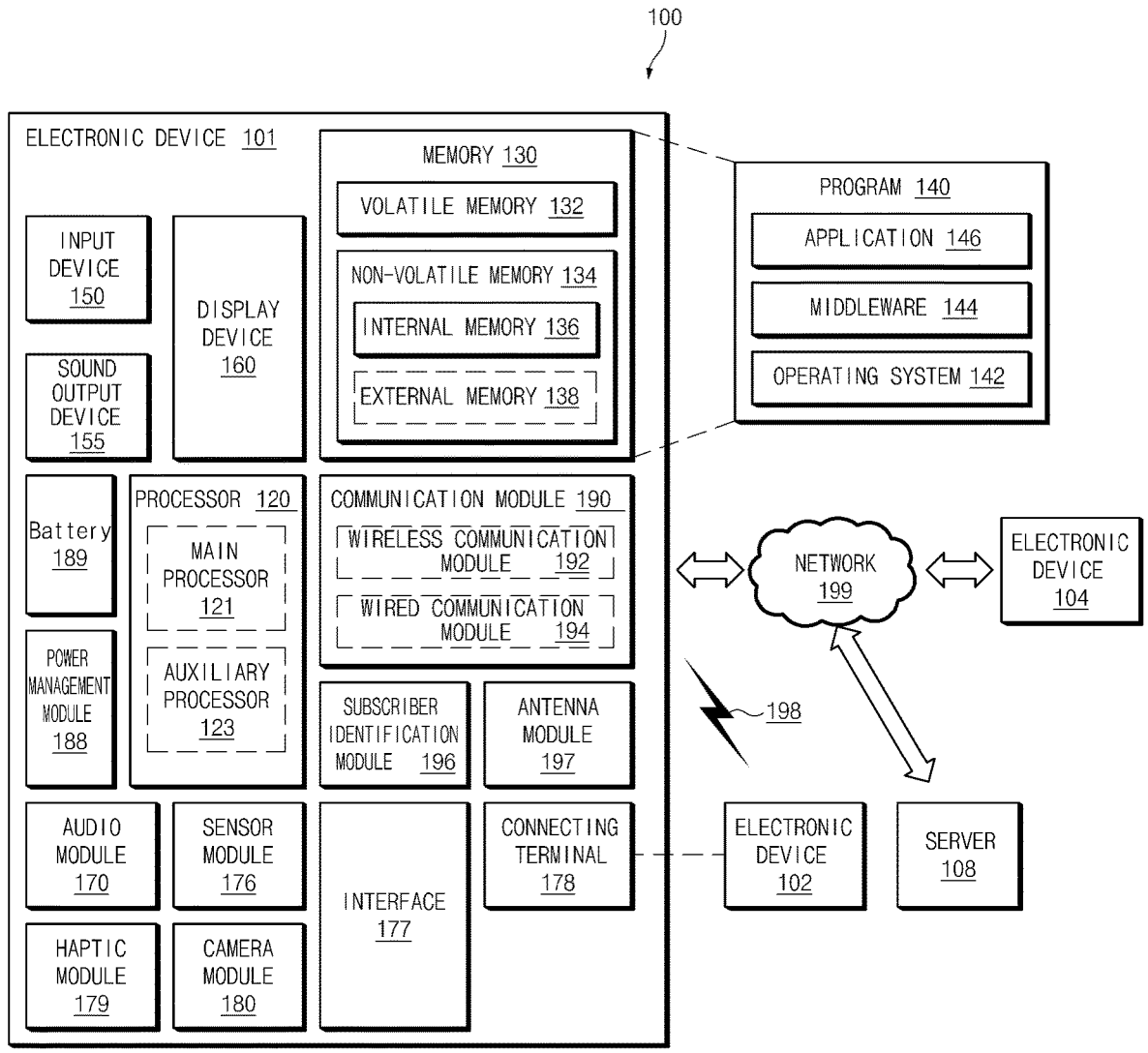
FIG. 1 is a block diagram of an electronic device, which includes a flexible display panel, in a network environment according to various embodiments.

FIG. 1 is a block diagram of an electronic device 101, which includes a flexible display panel, in a network environment 100 according to various embodiments. The flexible display panel may be bent to maximize the display area on the front surface and reduce the bezel area.

Referring to FIG. 1, the electronic device 101 may communicate with an electronic device 102 through a first network 198 (e.g., a short-range wireless communication) or may communicate with an electronic device 104 or a server 108 through a second network 199 (e.g., a long-distance wireless communication) in the network environment 100. According to an embodiment, the electronic device 101 may communicate with the electronic device 104 through the server 108. According to an embodiment, the electronic device 101 may include a processor 120, a memory 130, an input device 150, a sound output device 155, a display device 160, an audio module 170, a sensor module 176, an interface 177, a haptic module 179, a camera module 180, a power management module 188, a battery 189, a communication module 190, a subscriber identification module 196, and an antenna module 197. According to some embodiments, at least one of the components of the electronic device 101 may be omitted or other components may be added to the electronic device 101. According to some embodiments, some components may be integrated and implemented as in the case of the sensor module 176 (e.g., a fingerprint sensor, an iris sensor, or an illuminance sensor) embedded in the display device 160 (e.g., a display).

The processor 120 may operate, for example, software (e.g., a program 140) to control at least one of other components (e.g., a hardware or software component) of the electronic device 101 connected to the processor 120 and may process and compute a variety of data. The processor 120 may load a command set or data, which is received from other components (e.g., the sensor module 176 or the communication module 190), into a volatile memory 132, may process the loaded command or data, and may store result data into a nonvolatile memory 134. According to an embodiment, the processor 120 may include a main processor 121 (e.g., a central processing unit or an application processor) and an coprocessor 123 (e.g., a graphic processing device, an image signal processor, a sensor hub processor, or a communication processor), which operates independently from the main processor 121, additionally or alternatively uses less power than the main processor 121, or is specified to a designated function. In this case, the coprocessor 123 may operate separately from the main processor 121 or embedded.

In this case, the coprocessor 123 may control, for example, at least some of functions or states associated with at least one component (e.g., the display device 160, the sensor module 176, or the communication module 190) among the components of the electronic device 101 instead of the main processor 121 while the main processor 121 is in an inactive (e.g., sleep) state or together with the main processor 121 while the main processor 121 is in an active (e.g., an application execution) state. According to an embodiment, the coprocessor 123 (e.g., the image signal processor or the communication processor) may be implemented as a part of another component (e.g., the camera module 180 or the communication module 190) that is functionally related to the coprocessor 123. The memory 130 may store a variety of data used by at least one component (e.g., the processor 120 or the sensor module 176) of the electronic device 101, for example, software (e.g., the program 140) and input data or output data with respect to commands associated with the software. The memory 130 may include the volatile memory 132 or the nonvolatile memory 134.

The program 140 may be stored in the memory 130 as software and may include, for example, an operating system 142, a middleware 144, or an application 146.

The input device 150 may be a device for receiving a command or data, which is used for a component (e.g., the processor 120) of the electronic device 101, from an outside (e.g., a user) of the electronic device 101 and may include, for example, a microphone, a mouse, or a keyboard.

The sound output device 155 may be a device for outputting a sound signal to the outside of the electronic device 101 and may include, for example, a speaker used for general purposes, such as multimedia play or recordings play, and a receiver used only for receiving calls. According to an embodiment, the receiver and the speaker may be either integrally or separately implemented.

The display device 160 may be a device for visually presenting information to the user and may include, for example, a display, and a control circuit for controlling a corresponding device. According to an embodiment, the display device 160 may include a touch circuitry or a pressure sensor for measuring an intensity of pressure on the touch. The display device 160 will be described in greater detail in FIG. 2. In certain embodiments, the display may include a lower substrate that is bent, thereby increasing the display area. Hardware modules below the display may be connected to components in the screen area using leads. Although the substrate is bent, in certain embodiments, increased tension exerted on the leads is alleviated as will be described below.

The audio module 170 may convert a sound and an electrical signal in dual directions. According to an embodiment, the audio module 170 may obtain the sound through the input device 150 or may output the sound through an external electronic device (e.g., the electronic device 102

(e.g., a speaker or a headphone)) wired or wirelessly connected to the sound output device 155 or the electronic device 101.

The sensor module 176 may generate an electrical signal or a data value corresponding to an operating state (e.g., power or temperature) inside or an environmental state outside the electronic device 101. The sensor module 176 may include, for example, a gesture sensor, a gyro sensor, a barometric pressure sensor, a magnetic sensor, an acceleration sensor, a grip sensor, a proximity sensor, a color sensor, an infrared sensor, a biometric sensor, a temperature sensor, a humidity sensor, or an illuminance sensor.

The interface 177 may support a designated protocol wired or wirelessly connected to the external electronic device (e.g., the electronic device 102). According to an embodiment, the interface 177 may include, for example, an HDMI (high-definition multimedia interface), a USB (universal serial bus) interface, an SD card interface, or an audio interface.

A connection terminal 178 may include a connector that physically connects the electronic device 101 to the external electronic device (e.g., the electronic device 102), for example, an HDMI connector, a USB connector, an SD card connector, or an audio connector (e.g., a headphone connector).

The haptic module 179 may convert an electrical signal to a mechanical stimulation (e.g., vibration or movement) or an electrical stimulation perceived by the user through tactile or kinesthetic sensations. The haptic module 179 may include, for example, a motor, a piezoelectric element, or an electric stimulator.

The camera module 180 may shoot a still image or a video image. According to an embodiment, the camera module 180 may include, for example, at least one lens, an image sensor, an image signal processor, or a flash.

The power management module 188 may be a module for managing power supplied to the electronic device 101 and may serve as at least a part of a power management integrated circuit (PMIC).

The battery 189 may be a device for supplying power to at least one component of the electronic device 101 and may include, for example, anon-rechargeable (primary) battery, a rechargeable (secondary) battery, or a fuel cell.

The communication module 190 may establish a wired or wireless communication channel between the electronic device 101 and the external electronic device (e.g., the electronic device 102, the electronic device 104, or the server 108) and support communication execution through the established communication channel. The communication module 190 may include at least one communication processor operating independently from the processor 120 (e.g., the application processor) and supporting the wired communication or the wireless communication. According to an embodiment, the communication module 190 may include a wireless communication module 192 (e.g., a cellular communication module, a short-range wireless communication module, or a GNSS (global navigation satellite system) communication module) or a wired communication module 194 (e.g., an LAN (local area network) communication module or a power line communication module) and may communicate with the external electronic device using a corresponding communication module among them through the first network 198 (e.g., the short-range communication network such as a Bluetooth, a WiFi direct, or an IrDA (infrared data association)) or the second network 199 (e.g., the long-distance wireless communication network such as a cellular network, an internet, or a computer network (e.g., LAN or WAN)). The above-mentioned various communication modules 190 may be implemented into one chip or into separate chips, respectively.

According to an embodiment, the wireless communication module 192 may identify and authenticate the electronic device 101 using user information stored in the subscriber identification module 196 in the communication network.

The antenna module 197 may include one or more antennas to transmit or receive the signal or power to or from an external source. According to an embodiment, the communication module 190 (e.g., the wireless communication module 192) may transmit or receive the signal to or from the external electronic device through the antenna suitable for the communication method.

Some components among the components may be connected to each other through a communication method (e.g., a bus, a GPIO (general purpose input/output), an SPI (serial peripheral interface), or an MIPI (mobile industry processor interface)) used between peripheral devices to exchange signals (e.g., a command or data) with each other.

According to an embodiment, the command or data may be transmitted or received between the electronic device 101 and the external electronic device 104 through the server 108 connected to the second network 199. Each of the electronic devices 102 and 104 may be the same or different types as or from the electronic device 101. According to an embodiment, all or some of the operations performed by the electronic device 101 may be performed by another electronic device or a plurality of external electronic devices. When the electronic device 101 performs some functions or services automatically or by request, the electronic device 101 may request the external electronic device to perform at least some of the functions related to the functions or services, in addition to or instead of performing the functions or services by itself. The external electronic device receiving the request may carry out the requested function or the additional function and transmit the result to the electronic device 101. The electronic device 101 may provide the requested functions or services based on the received result as is or after additionally processing the received result. To this end, for example, a cloud computing, distributed computing, or client-server computing technology may be used.

Figure 2:
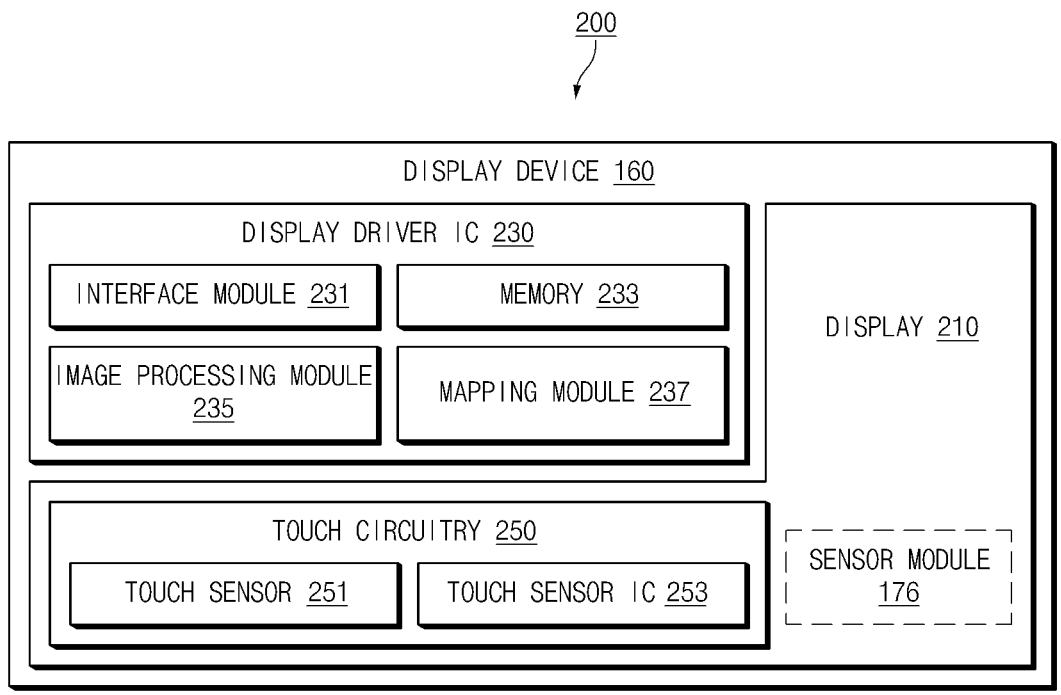
FIG. 2 is a block diagram of a display device, which includes a flexible display panel, according to various embodiments.

FIG. 2 is a block diagram 200 of the display device 160, which includes a flexible display panel, according to various embodiments.

Referring to FIG. 2, the display device 160 may include a display 210 and a display driver IC (DDI) 230 for controlling the display 210. The DDI 230 may include an interface module 231, a memory 233 (e.g., a buffer memory), an image processing module 235, or a mapping module 237. The DDI 230 may receive image information including image data or an image control signal corresponding to a command for controlling the image data, from the processor 120 (e.g., the main processor 121 (e.g., an application processor) or the coprocessor 123 operating independently of the main processor 121) through the interface module 231.

The DDI 230 may be in communication with touch circuitry 250 or the sensor module 176 through the interface module 231. Furthermore, the DDI 230 may store at least a portion of the received image information in the memory 233, for example, on a frame-by-frame basis. The image processing module 235 may pre-process or post-process at least a part of the image data (e.g., adjust the resolution, brightness, or size thereof), based at least on characteristics of the image data or characteristics of the display 210. The mapping module 237 may convert the image data pre-processed or post-processed through the image processing module 235 into a voltage or current value for driving pixels of the display 210, based at least partly on properties of the pixels (e.g., an arrangement of the pixels (RGB stripe or PenTile) or the sizes of sub-pixels). At least some pixels of the display 210 may be driven based on the voltage or current value, and visual information (e.g., text, an image, or an icon) corresponding to the image data may be displayed on the display 210 correspondingly. In certain embodiments, the DDI 160 can be disposed on a flexible substrate corresponding to a planar area.

According to an embodiment, the display device 160 may further include the touch circuitry 250. The touch circuitry 250 may include a touch sensor 251 and a touch sensor IC 253 for controlling the touch sensor 251. The touch sensor IC 253 may control the touch sensor 251 to measure a change in signal (e.g., voltage, an amount of light, resistance, or an amount of electric charge) for a specific location of the display 210 to detect a touch or hovering input to the specific location and may provide, to the processor 120, information (e.g., location, area, pressure, or time) about the detected touch or hovering input. According to an embodiment, at least a part (e.g., the touch sensor IC 253) of the touch circuitry 250 may be included as a part of the display driver IC 230 or the display 210 or a part of another component (e.g., the coprocessor 123) disposed outside the display device 160. In certain embodiments, the touch sensor IC 253 and the touch sensor 251 can be connected by a lead.

According to an embodiment, the display device 160 may further include at least one sensor (e.g., a fingerprint sensor, an iris sensor, a pressure sensor, or an illuminance sensor) of the sensor module 176 or a control circuit for the at least one sensor. In this case, the at least one sensor or the control circuit for the same may be embedded and implemented in a part (e.g., the display 210 or the DDI 230) of the display device 160 or a part of the touch circuitry 250. For example, in the case where the sensor module 176 embedded in the display device 160 includes a biometric sensor (e.g., a fingerprint sensor), the biometric sensor may obtain biometric information (e.g., a fingerprint image) associated with a touch input, through a partial area of the display 210. In another example, in the case where the sensor module 176 embedded in the display device 160 includes a pressure sensor, the pressure sensor may obtain pressure information on a touch input, through all or a part of the display 210. According to an embodiment, the touch sensor 251 or the sensor module 176 may be disposed between pixels in a pixel layer of the display 210 or above or below the pixel layer.

Figure 3:
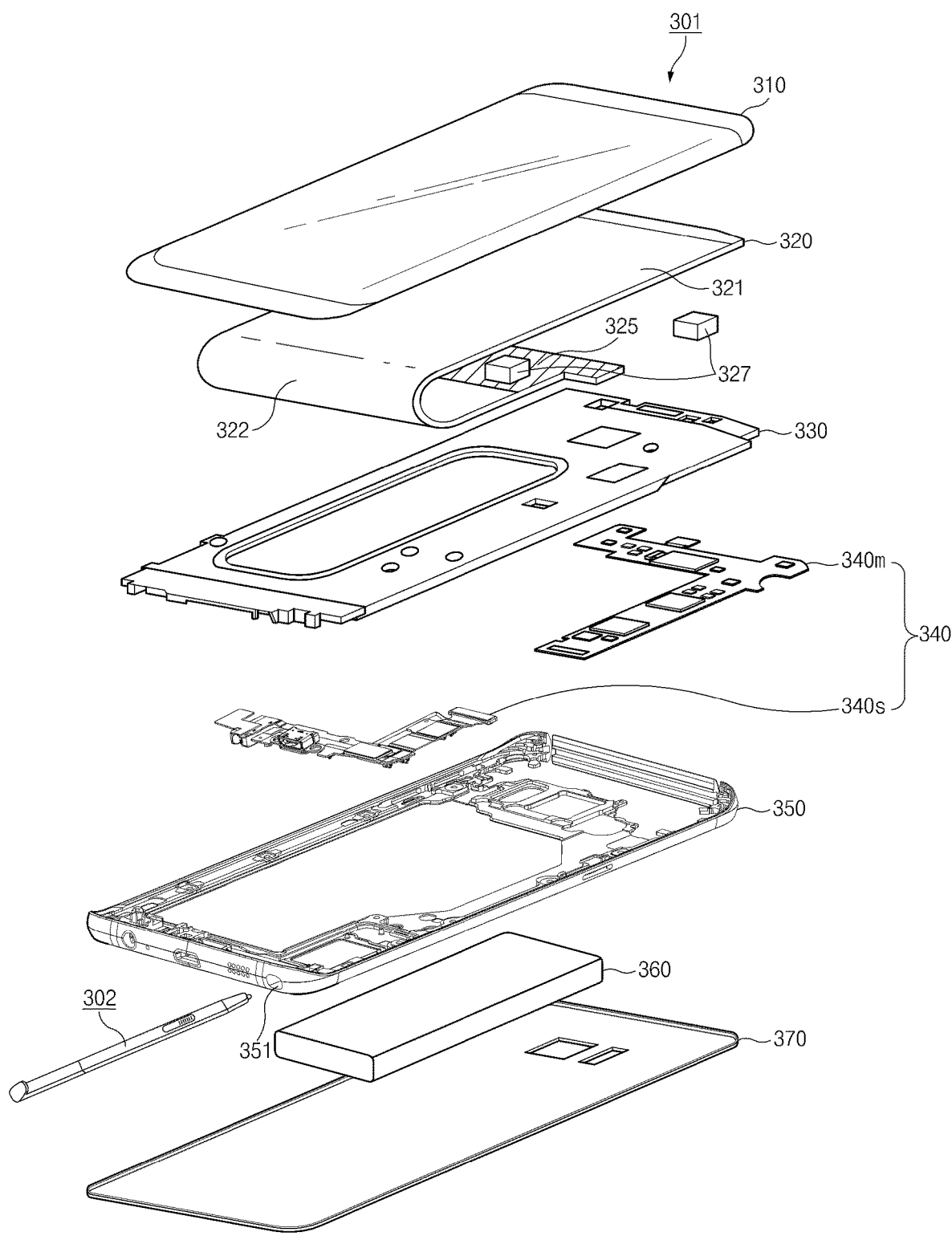
FIG. 3 illustrates an exploded perspective view of an electronic device according to an embodiment.

FIG. 3 illustrates an exploded perspective view of an electronic device according to an embodiment.

Referring to FIG. 3, an electronic device 301 according to an embodiment (e.g., the electronic device 101 of FIG. 1) may include a cover glass 310, a display device 320, a front hardware module 327, a support member 330, a printed circuit board 340, a side member 350, a battery 360, and/or a back cover 370. According to various embodiments, the electronic device 301 may not include some of the components illustrated in FIG. 3 and may further include components not illustrated in FIG. 3.

According to an embodiment, the cover glass 310 may pass light generated by the display device 320. In another example, a user may touch the cover glass 310 with a part (e.g., a finger) of the user's body to provide a touch input (including contact using an electronic pen) to the electronic device 301. The cover glass 310 may be formed of, for example, reinforced glass, reinforced plastic, a flexible polymer, or the like and may protect the display device 320 and components included in the electronic device 301 from an external impact. According to various embodiments, the cover glass 310 may also be referred to as a glass window or a transparent member.

According to an embodiment, the display device 320 may be disposed in a space between the cover glass 310 and the back cover 370. For example, the display device 320 may be disposed on, or coupled to, the bottom of the cover glass 310 and may be exposed through at least a portion of the cover glass 310. The display device 320 may output contents (e.g., text, an image, a video, an icon, a widget, or a symbol), or may receive an input (e.g., a touch input or an electronic pen input) from the user.

According to an embodiment, the display device 320 may include a display panel, a touch sensor, and/or an electronic pen sensor. The display panel may include, for example, a liquid crystal display (LCD) panel, a light-emitting diode (LED) display panel, an organic light-emitting diode (OLED) display panel, a microelectromechanical systems (MEMS) display panel, or an electronic paper display panel. The touch sensor may include a capacitive touch panel, a pressure-sensitive touch panel, a resistive touch panel, an infrared touch panel, or an ultrasonic touch panel. The touch panel may be inserted into the display panel (an add-on touch panel), may be directly formed on the display panel (an on-cell touch panel), or may be included in the display panel (an in-cell touch panel). The electronic pen sensor (e.g., a digitizer) may detect a touch, a gesture, hovering, or the like from an electronic pen. In various embodiments, the display panel including the touch panel may be referred to as a touch sensitive display panel.

According to an embodiment, the display device 320 may include a screen area 321 and an extended area 322 that extends from one side (e.g., an upper side or a lower side) of the screen area 321. Pixels (e.g., OLEDs) of the display panel, electrical elements, a conductive pattern of the touch sensor, and/or a conductive pattern of the electronic pen sensor may be arranged in the screen area 321. The electrical elements arranged in the screen area 321 may be electrically connected to a flexible printed circuit board (FPCB) 325 located on a rear surface of the display device 320 through various conductive patterns (interconnection wires).

According to an embodiment, the screen area 321 may include an active area. The active area, which is a portion of the screen area 321, may include pixels arranged therein.

According to an embodiment, the extended area 322 may include a bent area. The bent area may be understood as an area where one side of the display device 320 is bent toward the rear surface of the display device 320.

In certain embodiments, the display device can include a flexible substrate, a thin film transistor (TFT) layer including a plurality of light-emitting elements, an insulation layer, and a touch sensor.

According to various embodiments, interconnection wiring of the FPCB 325 may pass by a side surface of the support member 330 and may be electrically connected to the printed circuit board 340 (e.g., a main printed circuit board 340*m*) through a specified connector. According to various embodiments, the extended area 322 may include pixels arranged therein for displaying various pieces of information, similarly to the screen area 321.

According to an embodiment, the extended area 322 may have a width that is substantially the same as (or within 5%), or different from, that of the screen area 321. For example, the extended area 322 may be narrower than the screen area 321. In this case, the active area, which is disposed in the screen area 321 and includes the pixels, may have a rectangular shape with rounded corners.

According to an embodiment, the front hardware module 327 may include various components, such as a fingerprint sensor, a camera module, a proximity sensor, an iris sensor, a receiver, and the like, which are arranged to face a front surface of the electronic device 301. The front hardware module 327 may be disposed below the display device 320. For example, the front hardware module 327 may be disposed between a specified area of the display device 320 and the back cover 370 and may be arranged to face the cover glass 310.

According to an embodiment, the support member 330 (e.g., a bracket) may be formed of metal or a polymer. The support member 330 may be disposed, for example, between the display device 320 and the printed circuit board 340. The support member 330 may be combined with the display device 320 and the printed circuit board 340 to physically support the display device 320 and the printed circuit board 340. According to an embodiment, the support member 330 may have a swelling gap formed therein in consideration of swelling of the battery 360 according to a secular change.

According to an embodiment, the printed circuit board 340 may include, for example, the main printed circuit board 340m and a sub-printed circuit board 340s. According to an embodiment, the main printed circuit board 340m and the sub-printed circuit board 340s may be disposed below the support member 330 and may be electrically connected together through a specified connector or specified interconnection wiring. The printed circuit boards 340m and 340s may be implemented with, for example, a rigid printed circuit board (rigid PCB) and/or an FPCB. According to an embodiment, various types of electronic parts, elements, and printed circuits (e.g., a processor, a memory, a communication circuit (e.g., a wireless communication circuit), and the like) of the electronic device 301 may be mounted or arranged on the printed circuit boards 340m and 340s. According to various embodiments, the printed circuit boards 340m and 340s may be referred to as a main board, a printed board assembly (PBA), or simply a PCB.

According to an embodiment, the side member 350 may be disposed between the printed circuit board 340 and the back cover 370 to accommodate components of the electronic device 301. The side member 350 may be combined with, for example, the support member 330 or the back cover 370 of the electronic device 301. The side member 350 may surround the space between the cover glass 310 and the back cover 370. According to various embodiments, a hole 351 extending long toward the inside of the side member 350 may be formed in a portion of the side member 350. For example, an electronic pen (stylus pen) 302 may be accommodated in the hole 351.

According to an embodiment, the battery 360 may convert chemical energy into electrical energy, and vice versa. For example, the battery 360 may convert chemical energy into electrical energy and may supply the electrical energy to the display device 320 and various components or modules mounted on the printed circuit board 340. In another example, the battery 360 may also convert electrical energy supplied from the outside into chemical energy and may store the chemical energy. According to an embodiment, the printed circuit board 340 may include a power management module for managing charge/discharge of the battery 360.

According to an embodiment, the back cover 370 may be coupled to a rear surface of the electronic device 301. The back cover 370 may be formed of reinforced glass, a plastic injection-molded material, and/or metal. According to various embodiments, the back cover 370 may be implemented integrally with the side member 350, or may be implemented to be detachable by a user. The back cover 370 may also be referred to as a rear case or a rear plate.

Figure 4:
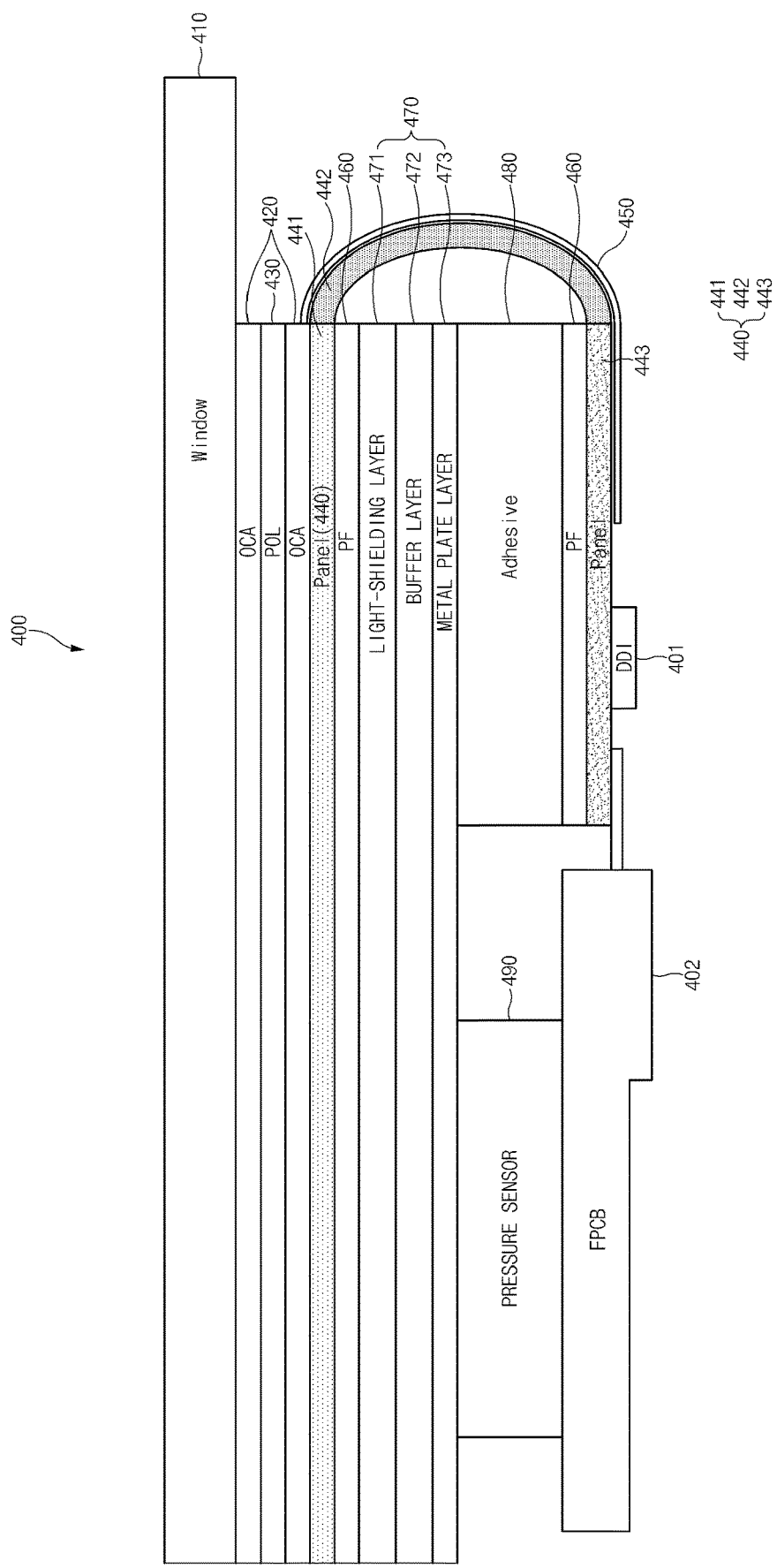
FIG. 4 illustrates an arrangement structure of a hardware module of an electronic device according to an embodiment.

FIG. 4 illustrates a hardware configuration of an electronic device according to an embodiment.

Referring to FIG. 4, an electronic device 400 may include a cover glass 410, an optical clear adhesive (OCA) 420, a polarizer (POL) 430, a display panel 440, a bending protecting layer (BPL) 450, a protection film (PF) 460, a back panel 470, an adhesive layer 480, a pressure sensor 490, a display driver IC (DDI) 401, and/or a flexible printed circuit board (FPCB) 402. According to various embodiments, the electronic device 400 (e.g., the electronic device 101 of FIG. 1) may not include some of the components illustrated in FIG. 4 and may further include components not illustrated in FIG. 4. For example, among the components illustrated in FIG. 4, adjacent components may be attached to each other by an adhesive tape not illustrated in FIG. 4.

The cover glass 410 may pass light generated by the display panel 440. According to an embodiment, a user may touch the cover glass 410 with a part (e.g., a finger) of the user's body to apply a touch input.

The OCA 420, which is a transparent adhesive layer, may stick the cover glass 410 and the polarizer 430 together. According to an embodiment, the OCA 420 may stick the polarizer 430 and the display panel 440 together.

The polarizer 430 may prevent reflection of external light to improve visibility in bright places such as the outdoors. For example, the polarizer (or polarizer film) 430 may improve visibility by passing only light waves oscillating in a specific direction among light waves input through the cover glass 410. In various embodiments, the polarizer 430 may include, for example, poly ethylene terephthalate (PET) or tri-acetyl cellulose (TAC).

The display panel 440 may include, for example, scan lines, data lines, light-emitting elements (e.g., OLEDs) that generate light based on signals supplied from the scan lines and the data lines, a substrate (e.g., a low-temperature poly silicon (LTPS) substrate) on which the light-emitting elements are arranged, and a thin film encapsulation (TFE) for protecting the light-emitting elements. The light-emitting elements may configure pixels. A plurality of (e.g., millions to tens of millions of) pixels may be arranged on any one surface of the display panel 440 (e.g., a surface facing the cover glass 410).

According to an embodiment, the display panel 440 may include a flexible substrate. According to an embodiment, the flexible substrate may extend from at least some layers of the display panel 440 to the outside. According to an embodiment, interconnection wire(s) for supplying power and/or signals to the display panel 440 may be arranged on the flexible substrate. For example, the interconnection wires can include leads. A lead can connect a control circuit to the display panel, wherein a first lead connects the control circuit to light-emitting elements, and another lead can connect the control circuit to a touch sensor on the display panel.

According to an embodiment, the display panel 440 may include a screen area 441 and extended areas 442 and 443. In an embodiment, the extended areas 442 and 443 may include the bent area 442 and the planar area 443. In an embodiment, a portion of the bent area 442 may be bent in a direction toward a rear surface of the display panel 440. In this case, a rear surface of the screen area 441 and a rear surface of the planar area 443 may face each other. In certain embodiments, the control circuit can be disposed under the planar area 443 with the leads traversing the extended areas connecting the control circuit to the light-emitting elements and touch sensor on the display panel.

According to an embodiment, the display panel 440 may be divided into an active area and an inactive area. In an embodiment, the active area may include light-emitting elements, and the inactive area may include the bent area 442.

According to an embodiment, the protection film (PF) 460 may be stuck to the display panel 440 to protect the display panel 440.

According to an embodiment, the BPL 450, which is a kind of insulator, may be stuck to the bent area 442 of the display panel 440. The BPL 450 may prevent the display panel 440 from being broken in the bent area 442 and may prevent cracks in leads arranged on the display panel 440. For example, when the BPL 450 is disposed on the bent area 442, the neutral plane to which stress is applied in the bent area 442 may be located closer to the leads to lower the possibility of cracks in the leads than when the BPL 450 is not present.

According to an embodiment, the back panel 470 may be disposed below the protection film 460. The back panel 470 may include at least one of a light-shielding layer 471 (e.g., a black layer including an uneven pattern) for shielding light generated by the display panel 440 or light incident from the outside, a buffer layer 472 (e.g., a sponge layer) for alleviating pressure from the outside, and a metal plate layer 473 (e.g., a copper (Cu) layer, or a graphite layer).

According to an embodiment, an opening (e.g., an opening with a thickness of 0.1 mm to 0.18 mm) may be formed in at least a partial area of the back panel 470. A fingerprint sensor (not illustrated) may be disposed in an area corresponding to the opening. According to an embodiment, the fingerprint sensor may obtain fingerprint information of a finger through the opening. In the case where the fingerprint sensor is of an optical type, the fingerprint sensor may be disposed in the area corresponding to the opening. In the case where the fingerprint sensor is of a capacitive type, the opening may not be formed in the back panel 470, or the fingerprint sensor may be disposed regardless of the opening.

According to an embodiment, the adhesive layer 480 may stick the metal plate layer 473 and the protection film 460 together. The adhesive layer 480 may physically support components above and below the adhesive layer 480.

According to an embodiment, the pressure sensor 490 may be disposed to correspond to the entire surface of the display panel 440, or may be disposed in only a partial area of the display panel 440. The pressure sensor 490 may be disposed to surround the fingerprint sensor. According to an embodiment, the pressure sensor 490 may obtain the magnitude of pressure of a user input (e.g., an input using a finger or an electronic pen) that is applied to the cover glass 410.

According to an embodiment, the DDI 401 may drive the pixels of the display panel 440. For example, the DDI 401 may receive image data from a processor (a host) and may supply signals corresponding to the image data to the display panel 440 based on a preset number of frames. According to an embodiment, the DDI 401 may be disposed on a surface of the planar area 443 of the display panel 440. In certain embodiments, the DDI 401 may be connected by a lead to a light-emitting elements on the screen area 441.

According to an embodiment, the FPCB 402 may be electrically connected to a portion of the display panel 440. For example, the FPCB 402 may be electrically connected to the interconnection wires formed on the substrate of the display panel 440. According to an embodiment, the FPCB 402 may include leads for supplying scan signals to a touch sensor included in the display panel 440.

According to an embodiment, the FPCB 402 may include interconnection wiring related to the components illustrated in FIG. 4. The FPCB 402 may correspond to, for example, the FPCB 325 illustrated in FIG. 3. For example, the interconnection wiring of the FPCB 402 may pass by a side surface of the support member 330 illustrated in FIG. 3 and may be electrically connected to the printed circuit board 340 (e.g., the main printed circuit board 340*m*) through a specified connector.

The curvature of the display panel 440 increases the display area, but can cause tension in wires traversing the extended areas 442. As will be described in certain embodiments below, the tension caused by the curvature of extended area 442 can be alleviated.

Figure 5:
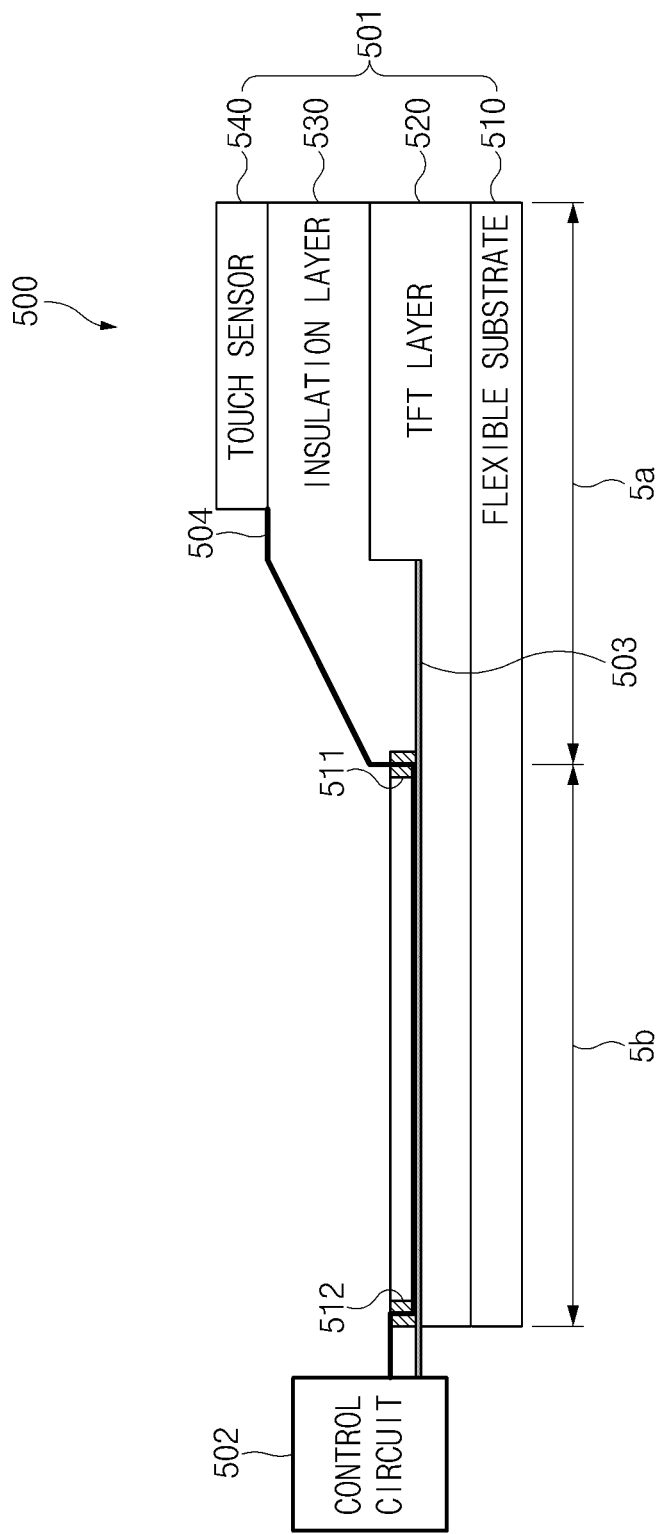
FIG. 5 illustrates a configuration of an electronic device according to an embodiment.

FIG. 5 illustrates a configuration of an electronic device according to an embodiment.

Referring to FIG. 5, an electronic device 500 (e.g., the electronic device 400 of FIG. 4) may include a touch sensitive display panel 501 (e.g., the display panel 440 of FIG. 4), a control circuit 502, first leads 503, and second leads 504. According to various embodiments, the electronic device 500 may not include some of the components, or may include additional components. The touch sensitive display panel 501 may include a flexible substrate 510, a thin film transistor (TFT) layer 520, an insulation layer 530, and a touch sensor 540. According to an embodiment, the touch sensitive display panel 501 may be divided into a screen area 5*a* and an extended area 5*b*. In an embodiment, the extended area 5*b* may be bent toward a rear surface of the display panel 501.

According to an embodiment, the display panel 501 in the screen area 5*a* may include light-emitting elements capable of emitting light according to electrical signals. The display panel 501 in the extended area 5*b* may include leads that electrically connect the light-emitting elements and/or the touch sensor 540 to the control circuit 502.

According to an embodiment, the flexible substrate 510 may be a substrate made of plastic or a polymer. In various embodiments, the flexible substrate 510 may include at least one of, for example, polyethylene terephthalate (PET), polyethylene naphthalate (PEN), polyethylene sulfide (PES), polyethylene (PE), and polyimide (PI). In various embodiments, the flexible substrate 510 may also be referred to as a flexible printed circuit board.

According to an embodiment, leads and electrical elements for supplying power and/or signals to the display panel 501 may be arranged on the flexible substrate 510. For example, leads, transistors, and light-emitting elements included in the TFT layer 520 may be arranged on the flexible substrate 510.

According to an embodiment, the TFT layer 520 may be understood as a set of various types of electrical elements arranged on the flexible substrate 510. For example, the TFT layer 520 may include a plurality of light-emitting elements. The plurality of light-emitting elements may correspond to, for example, organic light-emitting diodes (OLEDs).

In various embodiments, the arrangement of the electrical elements on the TFT layer 520 may be understood to be the same as, or similar to, the formation of the electrical elements on the flexible substrate 510.

According to an embodiment, the insulation layer 530 may be formed on the TFT layer 520. According to an embodiment, the insulation layer 530 may be applied onto the TFT layer 520 to prevent electrical short between the electrical elements included in the TFT layer 520. In an embodiment, a portion of the insulation layer 530 may be a thin film encapsulation. The thin film encapsulation may protect the plurality of light-emitting elements from moisture or oxygen by forming, for example, a plurality of organic layers and/or inorganic layers.

According to an embodiment, the insulation layer 530 may have via-holes 511 and 512 formed therein. In an embodiment, one or more via-holes 511 and 512 may be formed. In an embodiment, the via-holes 511 and 512 may be located at the border between the screen area 5a and the extended area 5b. In various embodiments, the via-holes 511 and 512 may also be located in either the screen area 5a or the extended area 5b. In an embodiment, leads (e.g., the second leads 504) may extend from the top to the bottom of the insulation layer 530 through the via-holes 511 and 512, or vice versa.

According to an embodiment, the touch sensor 540 may be disposed on the insulation layer 530. The touch sensor 540 may detect a user's touch on a cover glass of the electronic device 500 (e.g., the cover glass 410 of FIG. 4).

According to an embodiment, the touch sensor 540 may include a touch electrode. The touch electrode may be a terminal for a signal transmitted to or from the touch sensor 540. The touch electrode may be disposed, for example, on or over the flexible substrate 510. For example, the touch electrode may be directly formed on the flexible substrate 510, or may be disposed on or over the insulation layer 530 or a conductive layer (not illustrated) disposed over the flexible substrate 510.

The control circuit 502 may be electrically connected to the display panel 501 and may control an operation of the display panel 501. For example, the control circuit 502 may be electrically connected to the display panel 501 through the first leads 503 and the second leads 504.

According to an embodiment, the control circuit 502 may include a display driver integrated circuit (DDI) and a touch sensor IC. In various embodiments, the display driver IC and the touch sensor IC may be implemented with a single chip, or may be implemented with separate chips that are physically distinguished from each other. According to an embodiment, the extended area 5b of the display panel 501 may include a bent area (e.g., the bent area 442 of FIG. 4) and a planar area (e.g., the planar area 443 of FIG. 4). In this case, the display driver IC may be disposed on the flexible substrate 510 corresponding to the planar area.

The first leads 503 may be formed on the TFT layer 520 in the screen area 5a and the extended area 5b. In other words, the first leads 503 may be formed below the insulation layer 530 in the screen area 5a and the extended area 5b.

According to an embodiment, the first leads 503 may electrically connect the control circuit 502 and the plurality of light-emitting elements included in the TFT layer 520. According to an embodiment, the control circuit 502 may include the display driver IC. The first leads 503 may electrically connect the display driver IC and the plurality of light-emitting elements. In an embodiment, the display driver IC may transmit power and/or image signals to the plurality of light-emitting elements through the first leads 503.

The second leads 504 may be formed on the insulation layer 530 in the screen area 5a and on the TFT layer 520 in the extended area 5b and may extend from the screen area 5a to the extended area 5b through the one or more via-holes 511 formed in the insulation layer 530. According to an embodiment, the extended area 5b of the display panel 501 may include the bent area (e.g., the bent area 442 of FIG. 4) and the planar area (e.g., the planar 443 area of FIG. 4). In this case, the second leads 504 may extend from the bent area to the planar area through the one or more via-holes 512 formed in the insulation layer 530.

According to an embodiment, the second leads 504 may electrically connect the control circuit 502 and the touch sensor 540. According to an embodiment, the control circuit 502 may include the touch sensor IC. The second leads 504 may electrically connect the touch sensor IC and the touch sensor 540. In an embodiment, the touch sensor IC may receive detected electrical signals from the touch sensor 540 through the second leads 504.

According to various embodiments, the first leads 503 may also be referred to as first interconnection wires, and the second leads 504 may also be referred to as second interconnection wires.

The first leads 503 and the second leads 504 may be formed on the same layer in the extended area 5b according to the above-described lead arrangement and may not vertically overlap each other. That is, the first leads 503 and the second leads 504 may not overlap each other when viewed in a direction perpendicular to the bent area (e.g., the bent area 442 of FIG. 4). The lead arrangement may lower the possibility of cracks in the first leads 503 and/or the second leads 504.

According to an embodiment, the display panel 501 may further include a second insulation layer (e.g., the BPL 450 of FIG. 4) that is distinguished from the insulation layer 530. In an embodiment, the second insulation layer may be formed on the insulation layer 530. The second insulation layer may further reduce the risk of cracks in the first leads 503 and the second leads 504 in the bent area (e.g., the bent area 442 of FIG. 4) included in the extended area 5b.

Figure 6:
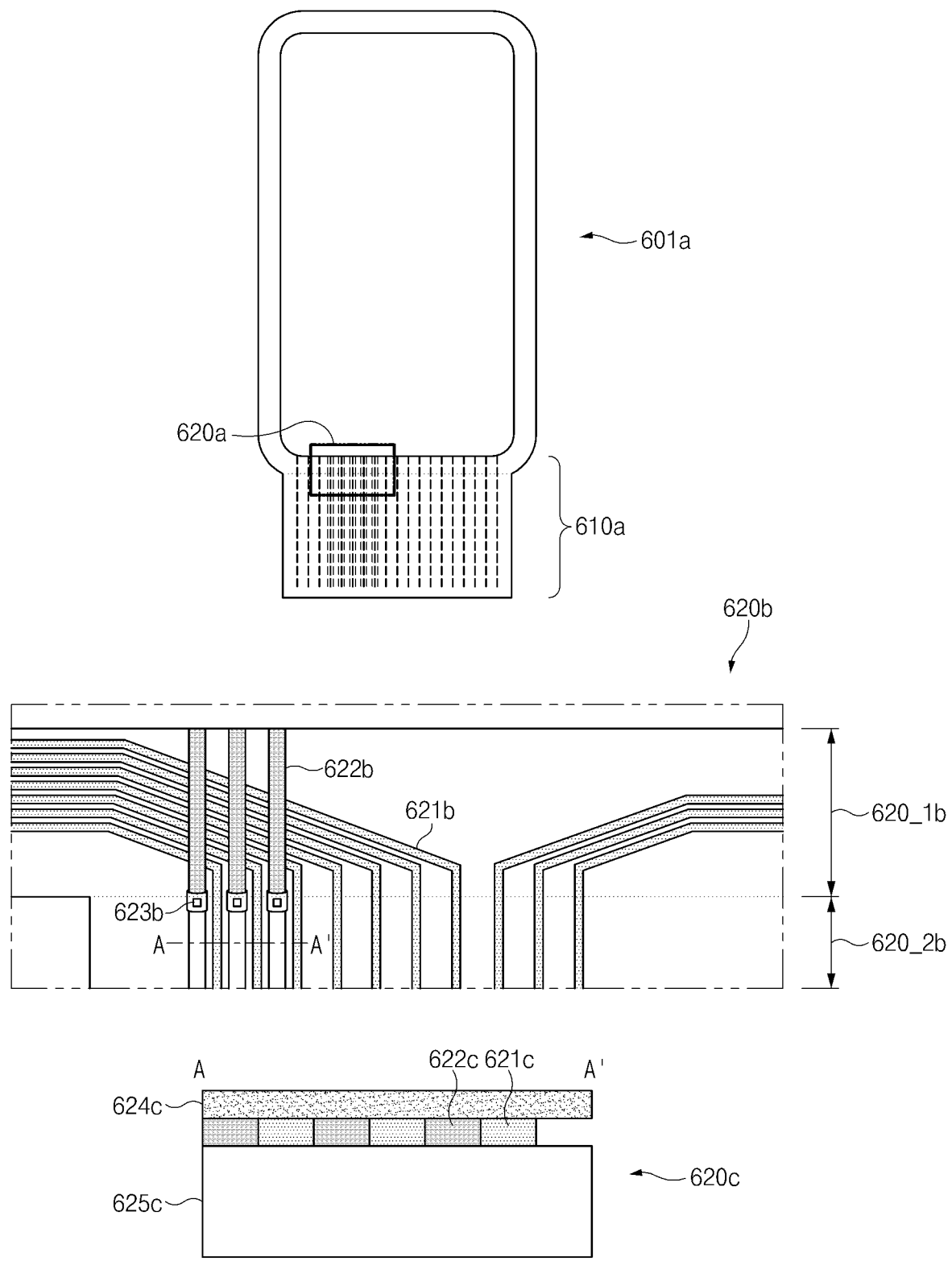
FIG. 6 illustrates an arrangement of leads in a display panel according to an embodiment.

FIG. 6 illustrates an arrangement of leads in a display panel according to an embodiment.

Referring to FIG. 6, a display panel 601a may include a flexible substrate 610a (e.g., the flexible substrate 510 of FIG. 5) that extends to the outside along some layers. In an embodiment, the flexible substrate 610a may have first leads (e.g., the first leads 503 of FIG. 5) and/or second leads (e.g., the second leads 504 of FIG. 5) arranged thereon. According to an embodiment, a portion of the flexible substrate may be a screen area (e.g., the screen area 5a of FIG. 5), and the remaining portion may be an extended area 610a (e.g., the extended area 5b of FIG. 5).

According to an embodiment, a blowup of a first area 620a of the flexible substrate 610a may be the same as, or similar to, a first area 620b. The first area 620b may be divided into a screen area 620_1b and an extended area 620_2b. First leads 621b and second leads 622b may be arranged on opposite layers in the screen area 620_1b. For example, the first leads 621b may be arranged on an insulation layer (e.g., the insulation layer 530 of FIG. 5), and the second leads 622b may be arranged below the insulation layer (e.g., on the TFT layer 520 of FIG. 5) in the extended area 620_2b. In this case, the first leads 621b and the second leads 622b may vertically overlap each other.

According to an embodiment, one or more via-holes 623b may be formed in the insulation layer in the vicinity of the border between the screen area 620_1b and the extended area 620_2b. In an embodiment, the second leads 622b may extend from the screen area 620_1b to the extended area 620_2b through the via-holes 623b. In other words, the second leads 622b may extend from the top to the bottom of the insulation layer through the via-holes 623b.

According to an embodiment, a sectional view taken along line A-A' in the extended area 620_2b of the first area 620b may be the same as, or similar to, a sectional view 620c. In an embodiment, referring to the sectional view 620c, first leads 621c and second leads 622c may be arranged between an insulation layer 624c and a flexible substrate 625c (e.g., on a TFT layer). Since the first leads 621c and the second leads 622c are arranged on the same layer in the extended area 620_2b, the possibility of cracks due to an overlap between the leads may be lowered even though the display panel 601a is bent in the extended area 620_2b.

According to an embodiment, the first leads 621c and the second leads 622c may be electrically isolated from each other. An electrical short may be prevented since the first leads 621c and the second leads 622c are electrically isolated from each other although arranged on the same layer.

Figure 7:
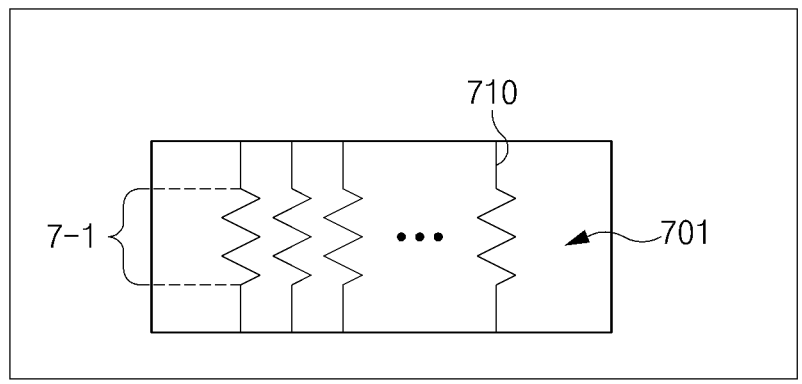
FIG. 7 illustrates an arrangement of leads in a bent area of a display panel according to an embodiment.

FIG. 7 illustrates an arrangement of leads in a bent area of a display panel according to an embodiment.

Referring to FIG. 7, the display panel according to an embodiment of the present disclosure may have various lead patterns in the bent area. The bent area may correspond to, for example, the bent area 442 illustrated in FIG. 4. A flexible substrate 701 illustrated in FIG. 7 may correspond to the flexible substrate 610a illustrated in FIG. 6.

When the bent area 7-1 of the flexible substrate 701 is bent, the distance between two points on the flexible substrate 701 increases. This can cause tension in leads. In various embodiments, the leads have a longer length, due to zig-zagging, or wave patterning, and increased thickness, to prevent cracks due to the tension.

According to an embodiment, leads 710 (e.g., first leads and second leads) may be arranged in a zigzag pattern in a bent area 7-1 of the flexible substrate 701. In this case, the possibility of cracks in the leads may be lowered since tension exerted on the leads decreases even though the bent area 7-1 of the flexible substrate 701 is bent.

According to another embodiment, unlike that illustrated in FIG. 7, leads (e.g., first leads and second leads) may be arranged in the bent area 7-1 of the flexible substrate 701 such that the leads extend at a specified angle (e.g., obliquely) with respect to the vertical direction. In this case, the possibility of cracks in the leads may be lowered since tension exerted on the leads decreases even though the bent area 7-1 of the flexible substrate 701 is bent.

According to another embodiment, unlike that illustrated in FIG. 7, leads (e.g., first leads and second leads) may be arranged in a wave pattern in the bent area 7-1 of the flexible substrate 701. In this case, the possibility of cracks in the leads may be lowered since tension exerted on the leads decreases even though the bent area 7-1 of the flexible substrate 701 is bent.

According to another embodiment, unlike that illustrated in FIG. 7, leads (e.g., first leads and second leads) may be formed to have a specified width or more in the bent area 7-1 of the flexible substrate 701. Since the leads are formed to be relatively thick, resistance to tension generated when the bent area 7-1 of the flexible substrate 701 is bent may increase. As a result, the possibility of cracks in the leads may be lowered.

According to another embodiment, unlike that illustrated in FIG. 7, leads (e.g., first leads and second leads) may be split into a specified number of leads in the bent area 7-1 of the flexible substrate 701. The leads may maintain an electrical connection even though some of the leads are cracked by tension generated when the bent area 7-1 of the flexible substrate 701 is bent.

Figure 8:
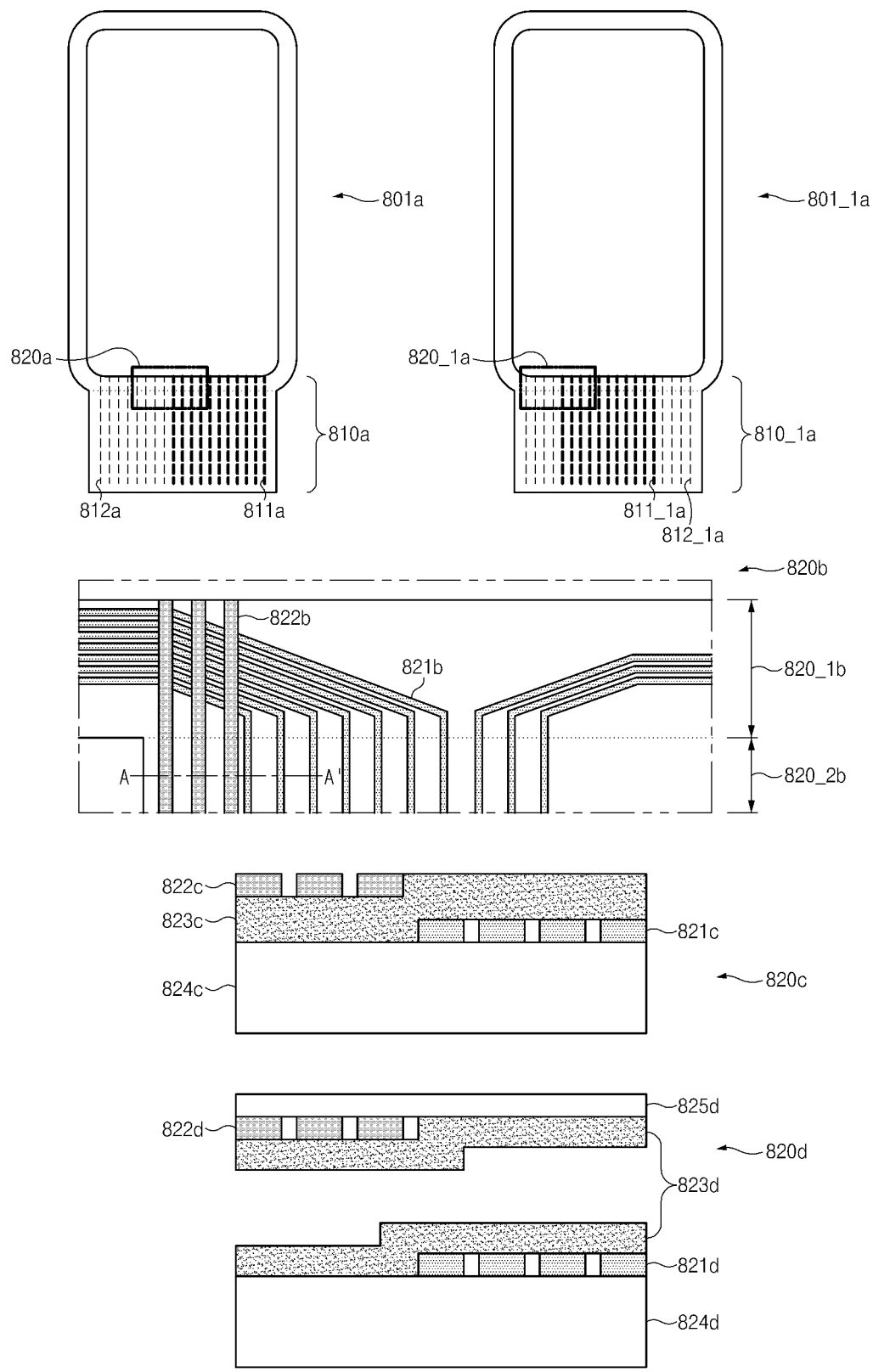
FIG. 8 illustrates an arrangement of leads in a display panel according to various embodiments.

FIG. 8 illustrates an arrangement of leads in a display panel according to various embodiments. In FIG. 8, the first leads 822 and second leads 821 are on opposite sides of the flexible substrate 820b in both the screen area 820_1b and the edge area 820_2b.

Referring to FIG. 8, a display panel 801a or 801_1a may include a flexible substrate 810a or 810_1a (e.g., the flexible substrate 510 of FIG. 5) that extends to the outside along some layers. In an embodiment, first leads 811a and/or second leads 812a may be arranged on the flexible substrate 810a, and first leads 811_1a and/or second leads 812_1a may be arranged on the flexible substrate 810_1a. According to various embodiments, the first leads 811a and the second leads 812a may be arranged such that the same type of leads are adjacent to one another, and the second leads 812_1a may be arranged on opposite sides of the first leads 811_1a. The contents that overlap the description of FIG. 6 may be omitted in the following description of FIG. 8.

According to an embodiment, blowups of first areas 820a and 820_1a of the flexible substrates 810a and 810_1a may be the same as, or similar to, a first area 820b.

The first area 820b may be divided into a screen area 820_1b and an extended area 820_2b. According to an embodiment, first leads 821b and second leads 822b may vertically overlap each other in the screen area 820_1b. According to an embodiment, the first leads 821b and the second leads 822b may be arranged in the extended area 820_2b so as not to vertically overlap each other.

According to an embodiment, a sectional view taken along line A-A' in the extended area 820_2b of the first area 820b may be the same as, or similar to, a sectional view 820c or 820d.

In an embodiment, referring to the sectional view 820c, first leads 821c may be arranged between an insulation layer 823c and a flexible substrate 824c (e.g., on a TFT layer). Second leads 822c may be arranged on the top of the insulation layer 823c. In an embodiment, since the first leads 821c and the second leads 822c do not vertically overlap each other even though arranged on different layers, the possibility of cracks due to an overlap between the leads may be lowered.

In an embodiment, referring to the sectional view 820d, the display panel 801a or 801_1a may further include a flexible substrate 825d distinguished from a flexible substrate 824d. In an embodiment, first leads 821d may be arranged between an insulation layer 823d and the flexible substrate 824d. In an embodiment, second leads 822d may be arranged between an insulation layer 823d and the flexible substrate 825d. In this case, the insulation layer 823d adjacent to the first leads 821d and the insulation layer 823d adjacent to the second leads 822d may be spaced apart from each other. In an embodiment, since the first leads 821d and the second leads 822d do not vertically overlap each other even though arranged on different layers, the possibility of cracks due to an overlap between the leads may be lowered.

Figure 9:
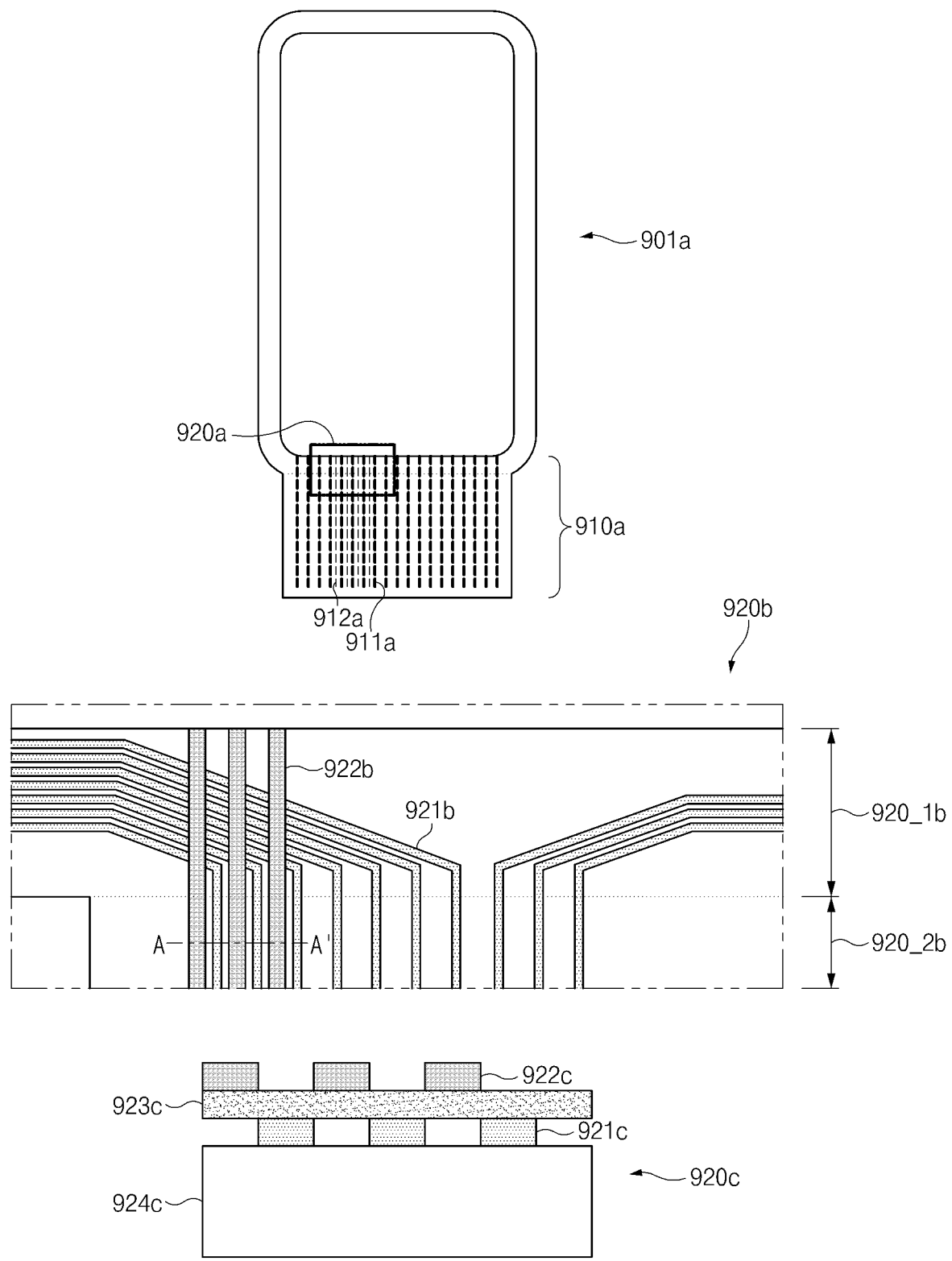
FIG. 9 illustrates an arrangement of leads in a display panel according to an embodiment.

FIG. 9 illustrates an arrangement of leads in a display panel according to an embodiment.

Referring to FIG. 9, a display panel 901a may include a flexible substrate 910a (e.g., the flexible substrate 510 of FIG. 5) that extends to the outside along some layers. In an embodiment, first leads 911a and/or second leads 912a may be arranged on the flexible substrate 910a. The contents that overlap the description of FIG. 6 and the description of FIG. 8 may be omitted in the following description of FIG. 9.

According to an embodiment, a blowup of a first area 920a of the flexible substrate 910a may be the same as, or similar to, a first area 920b.

The first area 920b may be divided into a screen area 920_1b and an extended area 920_2b. According to an embodiment, first leads 921b and second leads 922b may vertically overlap each other in the screen area 920_1b. According to an embodiment, the first leads 921b and the second leads 922b may be alternately arranged in the extended area 920_2b so as not to vertically overlap each other.

According to an embodiment, a sectional view taken along line A-A' in the extended area 920_2b of the first area 920b may be the same as, or similar to, a sectional view 920c.

In an embodiment, referring to the sectional view 920c, first leads 921c may be arranged between an insulation layer 923c and a flexible substrate 924c (e.g., on a TFT layer). Second leads 922c may be arranged on the top of the insulation layer 923c. In an embodiment, since the first leads 921c and the second leads 922c are alternately arranged so as not to vertically overlap each other even though arranged on different layers, the possibility of cracks due to an overlap between the leads may be lowered.

Figure 10:
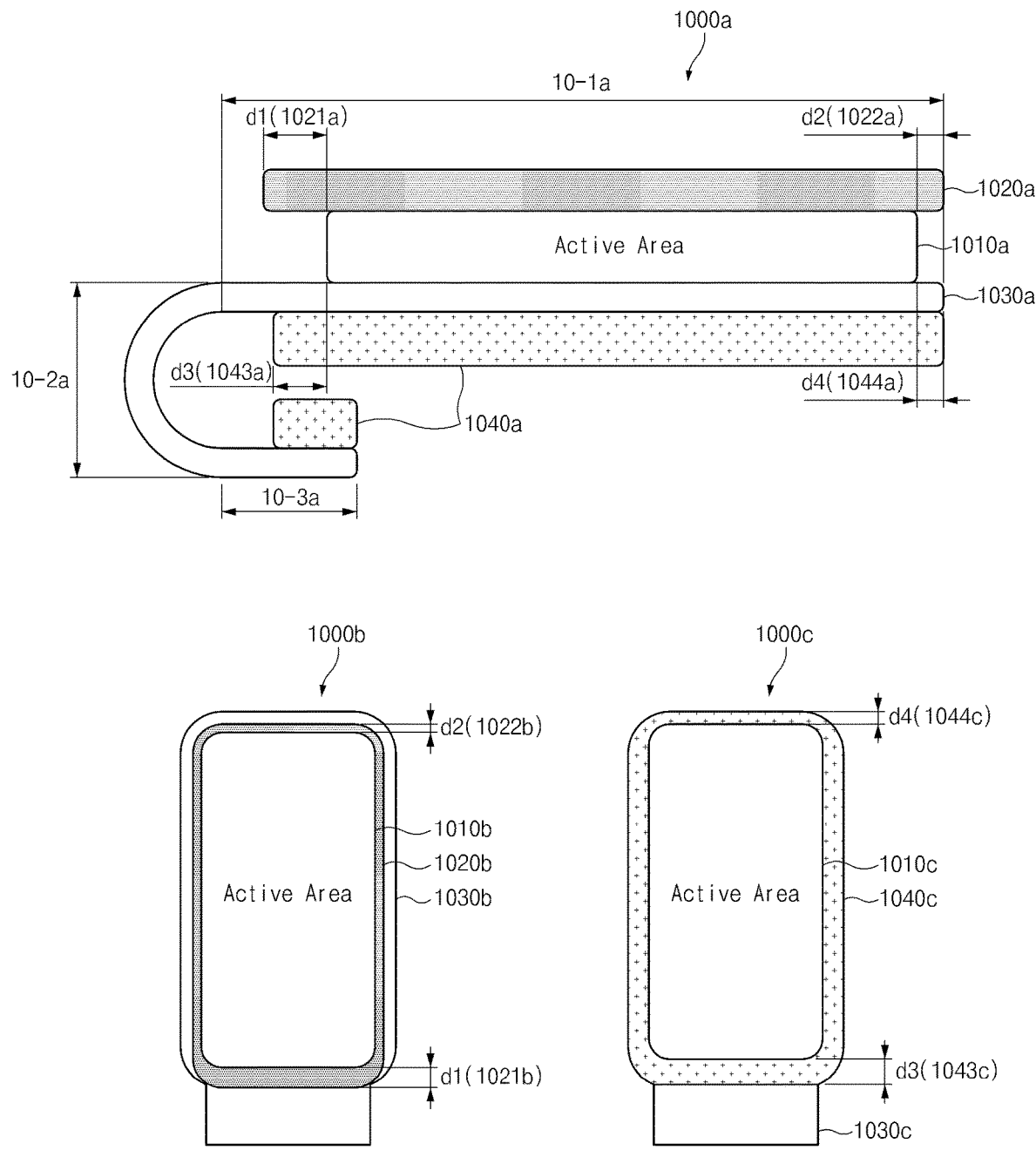
FIG. 10 illustrates a structure of an electronic device according to an embodiment.

FIG. 10 illustrates a structure of an electronic device according to an embodiment.

Referring to FIG. 10, stack structures and front views of electronic devices 1000a, 1000b, and 1000c are illustrated. The electronic devices 1000a, 1000b, and 1000c may correspond to, for example, the electronic device 101 illustrated in FIG. 1.

In an embodiment, the electronic device 1000a may include a display panel 1010a, a polarizer 1020a, a first polymer film 1030a, and a second polymer film 1040a. In various embodiments, the electronic device 1000a may not include some of the components or may include additional components, or one component may be included in another component. For example, the first polymer film 1030a may be understood as a component of the display panel 1010a.

The display panel 1010a may correspond to, for example, the display panel 440 of FIG. 4 or the display panel 501 of FIG. 5. According to an embodiment, the display panel 1010a may be divided into a plurality of areas. For example, the display panel 1010a may be divided into a screen area 10-1a and extended areas 10-2a and 10-3a. The extended areas 10-2a and 10-3a may be divided into the bent area 10-2a and the planar area 10-3a. It may be understood that only an active area of the display panel 1010a is illustrated in FIG. 10. The active area may be, for example, a portion of the screen area 10-1a of the display panel 1010a and may be understood as an area where pixels are arranged. A plurality of light-emitting elements may be densely arranged in the active area of the display panel 1010a.

The polarizer 1020a may correspond to, for example, the polarizer 430 of FIG. 4. In various embodiments, the polarizer 1020a may include, for example, a poly ethylene terephthalate (PET) film, a tri-acetyl cellulose (TAC) film, a cycle-olefin polymer (COP) film, or a poly-vinyl alcohol (PVA) film.

According to an embodiment, the polarizer 1020a may be longer than the active area. In an embodiment, the polarizer 1020a may completely surround the display panel 1010a corresponding to the active area and may protect the display panel 1010a from an external impact.

According to an embodiment, the polarizer 1020a may be longer than a lower portion of the active area by a first length d1 1021a and may be longer than an upper portion of the active area by a second length d2 1022a. In an embodiment, the first length d1 1021a may be longer than the second length d2 1022a since the extension of an upper portion of the electronic device 1000a is limited in consideration of minimization of a bezel. By making the first length d1 1021a longer than the second length d2 1022a, the polarizer 1020a may protect the active area of the display panel 1010a from an external impact.

The first polymer film 1030a may correspond to, for example, the flexible substrate 510 of FIG. 5. The first polymer film 1030a may constitute a part of the display panel 1010a, and various types of electrical elements included in the display panel 1010a may be arranged on the first polymer film 1030a. In various embodiments, the first polymer film 1030a may be implemented with polyethylene terephthalate (PET), polyethylene naphthalate (PEN), polyethylene sulfide (PES), polyethylene (PE), or polyimide (PI).

The second polymer film 1040a may correspond to, for example, the protection film 460 of FIG. 4. According to an embodiment, the second polymer film 1040a may be attached to a lower portion of the display panel 1010a to protect the display panel 1010a from an external impact applied from below the display panel 1010a. According to various embodiments, the second polymer film 1040a may be implemented with a material that is the same as, or similar to, that of the first polymer film 1030a.

According to an embodiment, the second polymer film 1040a may be longer than the active area. In an embodiment, the second polymer film 1040a may completely surround the display panel 1010a corresponding to the active area and may protect the display panel 1010a from an external impact applied from below the display panel 1010a.

According to an embodiment, the second polymer film 1040a may be longer than the lower portion of the active area by a third length d3 1043a and may be longer than the upper portion of the active area by a fourth length d4 1044a. In an embodiment, the third length d3 1043a may be longer than the fourth length d4 1044a since the extension of the upper portion of the electronic device 1000a is limited in consideration of minimization of the bezel. By making the third length d3 1043a longer than the fourth length d4 1044a, the second polymer film 1040a may protect the active area of the display panel 1010a from an external impact applied from below the display panel 1010a.

According to an embodiment, the polarizer 1020a and the second polymer film 1040a may be limited to the screen area 10-1a or the planar area 10-3a of the display panel 1010a. In other words, the polarizer 1020a and the second polymer film 1040a may not be disposed in the bent area 10-2a of the display panel 1010a. As a result, the display panel 1010a may be more flexibly bent in the bent area 10-2a and may prevent cracks in leads arranged in the bent area 10-2a.

Referring to the front view of the electronic device 1000b, the relative sizes of an active area of a display panel 1010b, a polarizer 1020b, and a first polymer film 1030b may be compared. According to an embodiment, the polarizer 1020b may be implemented to be larger than the active area of the display panel 1010b and smaller than the first polymer film 1030b. In an embodiment, the polarizer 1020b may be longer than an upper portion of the active area by a length d2 1022b and may be longer than a lower portion of the active area by a length d1 1021b. In this case, the length d1 1021b may be longer than the length d2 1022b.

Referring to the front view of the electronic device 1000c, the relative sizes of an active area of a display panel 1010c, a first polymer film 1030c, and a second polymer film 1040c may be compared. According to an embodiment, the second polymer film 1040c may be implemented to be larger than the active area of the display panel 1010c. According to an embodiment, the second polymer film 1040c may be implemented to be smaller than the first polymer film 1030c so as to be attached to the first polymer film 1030c. In an embodiment, the second polymer film 1040c may be longer than an upper portion of the active area by a length d4 1044c and may be longer than a lower portion of the active area by a length d3 1043c. In this case, the length d3 1043c may be longer than the length d4 1044c.

Figure 11:
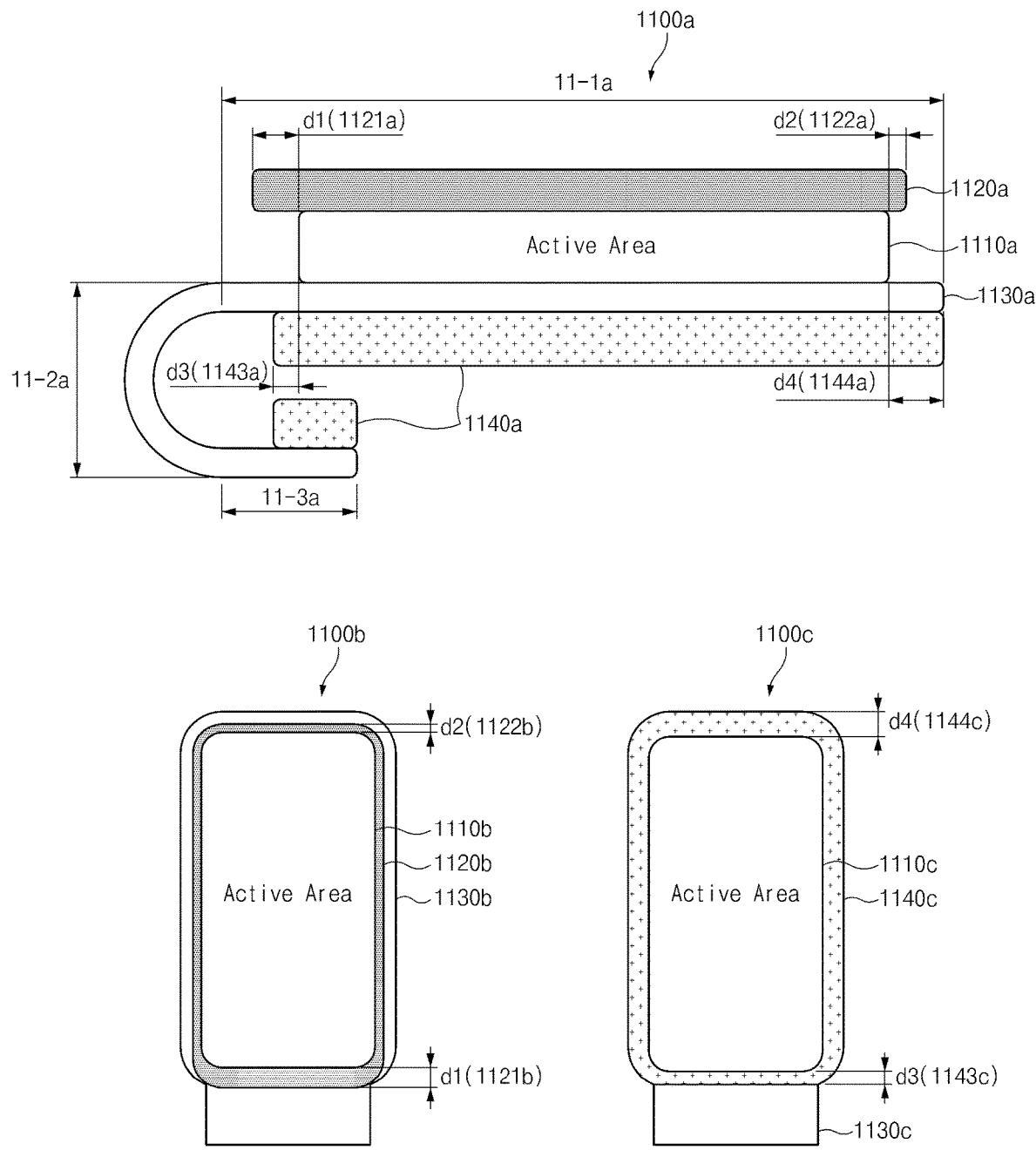
FIG. 11 illustrates a structure of an electronic device according to an embodiment.

FIG. 11 illustrates a structure of an electronic device according to an embodiment.

Referring to FIG. 11, stack structures and front views of electronic devices 1100a, 1100b, and 1100c are illustrated. The electronic devices 1100a, 1100b, and 1100c may correspond to, for example, the electronic devices 1000a, 1000b, and 1000c illustrated in FIG. 10. The contents that overlap the description of FIG. 10 may be omitted in the following description of FIG. 11.

In an embodiment, the electronic device 1100a may include a display panel 1110a, a polarizer 1120a, a first polymer film 1130a, and a second polymer film 1140a.

According to an embodiment, the polarizer 1120a and the second polymer film 1140a may be wider than an active area of the display panel 1110a to protect the display panel 1110a from an external impact.

According to an embodiment, the electronic device 1100a may protect the active area of the display panel 1110a and may allow a bent area 11-2a of the display panel 1110a to be more easily bent. According to an embodiment, the second polymer film 1140a may be further away from the bent area 11-2a of the display panel 1110a to allow the bent area 11-2a of the display panel 1110a to be more easily bent. In this case, a length d3 1143a may be shorter than a length d4 1144a. In an embodiment, by making the length d3 1143a shorter than the length d4 1144a, the second polymer film 1140a may allow the bent area 11-2a of the display panel 1110a to be more easily bent.

Referring to the front view of the electronic device 1100c, the relative sizes of an active area of a display panel 1110c, a first polymer film 1130c, and a second polymer film 1140c may be compared. According to an embodiment, the second polymer film 1140c may be longer than an upper portion of the active area by a length d4 1144c and may be longer than a lower portion of the active area by a length d3 1143c. In this case, the length d3 1143c may be shorter than the length d4 1144c.

According to embodiments of the present disclosure, by arranging leads in a bent area of a display of an electronic device that includes a display panel, it is possible to reduce the risk of cracks in the leads.

With the reduction in the risk of cracks in the leads, the curvature of the display panel in the electronic device may be set to be larger. Accordingly, a bezel area may be minimized with an increase in size of a screen area through which the display is exposed in the electronic device. The electronic device may provide better visibility for a user.

An electronic device according to an embodiment may include a first lead, a second lead, a touch sensitive display panel including a screen area and an extended area that extends from the screen area, and a control circuit electrically connected to the touch sensitive display panel through the first lead and the second lead. The touch sensitive display panel may include a flexible substrate, a thin film transistor (TFT) layer formed on the flexible substrate and including a plurality of light-emitting elements, an insulation layer that is disposed on the TFT layer and in which a via-hole is formed, and a touch sensor disposed on the insulation layer. The first lead may be formed on the TFT layer in the screen area and the extended area and may connect the control circuit and the plurality of light-emitting elements. The second lead may be formed on the insulation layer in the screen area and on the TFT layer in the extended area and may extend from the screen area to the extended area through the via-hole formed in the insulation layer. The second lead may connect the control circuit and the touch sensor.

According to an embodiment, the extended area may include a bent area, and at least a section of the bent area may be bent toward a rear surface of the touch sensitive display panel. According to an embodiment, the first lead and the second lead may be electrically isolated from each other. According to an embodiment, the flexible substrate may include polyimide (PI).

According to an embodiment, the control circuit may include a display driver IC and a touch sensor IC, the first lead may connect the display driver IC and the plurality of light-emitting elements, and the second lead may connect the touch sensor IC and the touch sensor.

According to an embodiment, the extended area may include a bent area and a planar area, and the display driver IC may be disposed on the flexible substrate corresponding to the planar area.

According to an embodiment, the plurality of light-emitting elements may include organic light-emitting diodes (OLEDs). According to an embodiment, a portion of the insulation layer in the screen area may include a thin film encapsulation (TFE).

According to an embodiment, the extended area may include a bent area, and the first lead and the second lead may be arranged in a zigzag pattern in the bent area.

According to another embodiment, the extended area may include a bent area, and the first lead and the second lead may be split into a specified number of leads in the bent area.

According to another embodiment, the extended area may include a bent area, and the first lead and the second lead may be arranged to have a thickness and a width above a specified range in the bent area.

According to another embodiment, the extended area may include a bent area, and the first lead and the second lead may be obliquely arranged in the bent area.

According to another embodiment, the extended area may include a bent area, and the first lead and the second lead may be arranged in a wave pattern in the bent area.

According to an embodiment, the touch sensitive display panel may further include a second insulation layer distinguished from the insulation layer. The extended area may include a bent area, and the second insulation layer may be formed on the insulation layer in the bent area.

A touch sensitive display panel according to an embodiment may include a flexible substrate, a thin film transistor (TFT) layer formed on the flexible substrate and including a plurality of light-emitting elements, an insulation layer that is disposed on the TFT layer, and a touch sensor disposed on the insulation layer. The touch sensitive display panel may include a screen area and an extended area that extends from the screen area. The plurality of light-emitting elements may be connected to at least one control circuit through a first lead formed on the TFT layer in the screen area and the extended area. The touch sensor may be connected to the at least one control circuit through a second lead formed on the insulation layer in the screen area and the extended area. The first lead and the second lead do not overlap each other in the extended area when viewed in a direction perpendicular to the extended area.

According to an embodiment, the extended area may include a bent area, and at least a section of the bent area may be bent toward a rear surface of the touch sensitive display panel.

According to an embodiment, the flexible substrate may include polyimide (PI).

According to an embodiment, the plurality of light-emitting elements may include organic light-emitting diodes (OLEDs).

According to an embodiment, a portion of the insulation layer in the screen area may include a thin film encapsulation (TFE).

According to an embodiment, the touch sensitive display panel may further include a second insulation layer distinguished from the insulation layer. The extended area may include a bent area, and the second insulation layer may be formed on the insulation layer in the bent area.

An electronic device according to an embodiment may include a touch sensitive display panel that includes an active area including a light-emitting element and an extended area distinguished from the active area and including a bent area. The touch sensitive display panel may include a flexible substrate, a touch electrode disposed on the flexible substrate, a first interconnection wire disposed on the flexible substrate and electrically connected to the light-emitting element, and a second interconnection wire disposed on the flexible substrate and electrically connected to the touch electrode. The first interconnection wire may be arranged in a first section of the bent area, and the second interconnection wire may be arranged in a second section of the bent area that does not overlap the first section.

According to an embodiment, the touch sensitive display panel may further include an insulation layer formed on the flexible substrate, and the touch electrode may be disposed on the insulation layer.

According to an embodiment, the touch sensitive display panel may further include a conductive layer formed on the flexible substrate, and the touch electrode may be disposed on the conductive layer.

An electronic device according to an embodiment may include a housing including a first surface, a second surface facing away from the first surface, and a transparent member that forms at least a portion of the first surface, a display panel disposed between the transparent member and the second surface, wherein the display panel includes an active area including a light-emitting element and an inactive area including a bent area, a touch sensor disposed between the transparent member and the display panel or inside the display panel, and a flexible printed circuit board electrically connected to the touch sensor and including a bent area. The display panel may include a first interconnection wire electrically connected to the light-emitting element, and the flexible printed circuit board may include a second interconnection wire electrically connected to the touch sensor. The first interconnection wire and the second interconnection wire may not overlap each other in the bent area of the display panel when viewed in a direction perpendicular to the bent area of the display panel.

An electronic device according to an embodiment may include a housing including a first surface, a second surface facing away from the first surface, and a transparent member that forms at least a portion of the first surface, a display panel disposed between the transparent member and the second surface, wherein the display panel includes an active area including a light-emitting element and an inactive area including a bent area, and a polarizer disposed between the transparent member and the display panel. The display panel may include a first polymer film and a second polymer film disposed between the first polymer film and the second surface and including a first portion and a second portion on opposite sides of a gap formed in at least a portion of the bent area. When viewed from above the first surface, a gap between a first side of the active area and a first side of the polarizer that are adjacent to the bent area may be larger than a gap between a second side of the active area and a second side of the polarizer that are spaced apart from the bent area. When viewed from above the first surface, a gap between the first side of the active area and a first side of the first portion that are adjacent to the bent area may be different from a gap between the second side of the active area and a second side of the first portion that are spaced apart from the bent area.

According to an embodiment, the gap between the first side of the active area and the first side of the first portion that are adjacent to the bent area may be larger than the gap between the second side of the active area and the second side of the first portion that are spaced apart from the bent area.

According to an embodiment, the gap between the first side of the active area and the first side of the first portion that are adjacent to the bent area may be smaller than the gap between the second side of the active area and the second side of the first portion that are spaced apart from the bent area.

The electronic device according to various embodiments disclosed in the present disclosure may be various types of devices. The electronic device may include, for example, at least one of a portable communication device (e.g., a smartphone), a computer device, a portable multimedia device, a mobile medical appliance, a camera, a wearable device, or a home appliance. The electronic device according to an embodiment of the present disclosure should not be limited to the above-mentioned devices.

It should be understood that various embodiments of the present disclosure and terms used in the embodiments do not intend to limit technologies disclosed in the present disclosure to the particular forms disclosed herein; rather, the present disclosure should be construed to cover various modifications, equivalents, and/or alternatives of embodiments of the present disclosure. With regard to description of drawings, similar components may be assigned with similar reference numerals. As used herein, singular forms may include plural forms as well unless the context clearly indicates otherwise. In the present disclosure disclosed herein, the expressions "A or B", "at least one of A or/and B", "A, B, or C" or "one or more of A, B, or/and C", and the like used herein may include any and all combinations of one or more of the associated listed items. The expressions "a first", "a second", "the first", or "the second", used in herein, may refer to various components regardless of the order and/or the importance, but do not limit the corresponding components. The above expressions are used merely for the purpose of distinguishing a component from the other components. It should be understood that when a component (e.g., a first component) is referred to as being (operatively or communicatively) "connected," or "coupled," to another component (e.g., a second component), it may be directly connected or coupled directly to the other component or any other component (e.g., a third component) may be interposed between them.

The term "module" used herein may represent, for example, a unit including one or more combinations of hardware, software and firmware. The term "module" may be interchangeably used with the terms "logic", "logical block", "part" and "circuit". The "module" may be a minimum unit of an integrated part or may be a part thereof. The "module" may be a minimum unit for performing one or more functions or a part thereof. For example, the "module" may include an application-specific integrated circuit (ASIC).

Various embodiments of the present disclosure may be implemented by software (e.g., the program 140) including an instruction stored in a machine-readable storage media (e.g., an internal memory 136 or an external memory 138) readable by a machine (e.g., a computer). The machine may be a device that calls the instruction from the machine-readable storage media and operates depending on the called instruction and may include the electronic device (e.g., the electronic device 101). When the instruction is executed by the processor (e.g., the processor 120), the processor may perform a function corresponding to the instruction directly or using other components under the control of the processor. The instruction may include a code generated or executed by a compiler or an interpreter. The machine-readable storage media may be provided in the form of non-transitory storage media. Here, the term "non-transitory", as used herein, is a limitation of the medium itself (i.e., tangible, not a signal) as opposed to a limitation on data storage persistency.

According to an embodiment, the method according to various embodiments disclosed in the present disclosure may be provided as a part of a computer program product. The computer program product may be traded between a seller and a buyer as a product. The computer program product may be distributed in the form of machine-readable storage medium (e.g., a compact disc read only memory (CD-ROM)) or may be distributed only through an application store (e.g., a Play Store™). In the case of online distribution, at least a portion of the computer program product may be temporarily stored or generated in a storage medium such as a memory of a manufacturer's server, an application store's server, or a relay server.

Each component (e.g., the module or the program) according to various embodiments may include at least one of the above components, and a portion of the above sub-components may be omitted, or additional other sub-components may be further included. Alternatively or additionally, some components (e.g., the module or the program) may be integrated in one component and may perform the same or similar functions performed by each corresponding components prior to the integration. Operations performed by a module, a programming, or other components according to various embodiments of the present disclosure may be executed sequentially, in parallel, repeatedly, or in a heuristic method. Also, at least some operations may be executed in different sequences, omitted, or other operations may be added.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An electronic device comprising:
   a first lead;
   a second lead;
   a touch sensitive display panel including a screen area and an extended area that extends from the screen area; and
   a control circuit electrically connected to the touch sensitive display panel through the first lead and the second lead,
   wherein the touch sensitive display panel includes:
      a flexible substrate having a first portion corresponding to the screen area and a second portion corresponding to the extended area;
      a thin film transistor (TFT) layer formed on the flexible substrate and including a plurality of light-emitting elements;
      an insulation layer that is disposed on the TFT layer and in which a via-hole is formed; and
      a touch sensor disposed on the insulation layer,
   wherein the first lead is formed on the TFT layer in the screen area and the extended area and connects the control circuit and the plurality of light-emitting elements,
   wherein the second lead is formed on the insulation layer in the screen area and on the TFT layer in the extended area and extends from the screen area to the extended area through the via-hole formed in the insulation layer, the second lead connecting the control circuit and the touch sensor,
   wherein the extended area includes a bent area,
   wherein the first lead and the second lead do not overlap each other in the bent area when viewed in a direction perpendicular to the bent area of the touch sensitive display panel, and
   wherein a portion of the insulation layer in the screen area includes a thin film encapsulation (TFE).

2. The electronic device of claim 1,
   wherein at least a section of the bent area is bent toward a rear surface of the touch sensitive display panel.

3. The electronic device of claim 1, wherein the first lead and the second lead are electrically isolated from each other.

4. The electronic device of claim 1, wherein the flexible substrate includes polyimide (PI).

5. The electronic device of claim 1, wherein the control circuit includes a display driver IC and a touch sensor IC,
   wherein the first lead connects the display driver IC and the plurality of light-emitting elements, and
   wherein the second lead connects the touch sensor IC and the touch sensor.

6. The electronic device of claim 5, wherein the extended area includes a planar area, and
   wherein the display driver IC is disposed on the flexible substrate corresponding to the planar area.

7. The electronic device of claim 1, wherein the plurality of light-emitting elements include organic light-emitting diodes (OLEDs).

8. The electronic device of claim 1,
   wherein the first lead and the second lead are arranged in a zigzag pattern in the bent area.

9. The electronic device of claim 1,
   wherein the first lead and the second lead are split into a specified number of leads in the bent area.

10. The electronic device of claim 1,
    wherein the first lead and the second lead are arranged to have a thickness and a width above a specified range in the bent area.

11. The electronic device of claim 1,
    wherein the first lead and the second lead are obliquely arranged in the bent area.

12. The electronic device of claim 1,
    wherein the first lead and the second lead are arranged in a wave pattern in the bent area.

13. The electronic device of claim 1, wherein the touch sensitive display panel further includes a second insulation layer distinguished from the insulation layer,
wherein the extended area includes a bent area, and
wherein the second insulation layer is formed on the insulation layer in the bent area.

14. A touch sensitive display panel comprising:
a flexible substrate having a first portion and a second portion corresponding to a screen area and an extended area of the touch sensitive display panel, respectively, wherein the extended area that extends from the screen area;
a thin film transistor (TFT) layer formed on the flexible substrate and including a plurality of light-emitting elements;
an insulation layer that is disposed on the TFT layer and in which a via-hole is formed; and
a touch sensor disposed on the insulation layer,
wherein the plurality of light-emitting elements are connected to at least one control circuit through a first lead formed on the TFT layer in the screen area and the extended area,
wherein the touch sensor is connected to the at least one control circuit through a second lead,
wherein the second lead is formed on the insulation layer in the screen area and on the TFT layer in the extended area and extends from the screen area to the extended area through the via-hole,
wherein the extended area includes a bent area,
wherein the first lead and the second lead do not overlap each other in the bent area when viewed in a direction perpendicular to the bent area of the touch sensitive display panel, and
wherein the first lead and the second lead are formed on a same layer in the bent area.

15. The touch sensitive display panel of claim 14, wherein at least a section of the bent area is bent toward a rear surface of the touch sensitive display panel.

16. The touch sensitive display panel of claim 14, wherein the flexible substrate includes polyimide (PI).

17. The touch sensitive display panel of claim 14, wherein the plurality of light-emitting elements include organic light-emitting diodes (OLEDs).

18. The touch sensitive display panel of claim 14, wherein a portion of the insulation layer in the screen area includes a thin film encapsulation (TFE).

19. The touch sensitive display panel of claim 14, further comprising:
a second insulation layer distinguished from the insulation layer,
wherein the second insulation layer is formed on the insulation layer in the bent area.

* * * * *